United States Patent
Kissos et al.

(10) Patent No.: US 11,711,099 B1
(45) Date of Patent: Jul. 25, 2023

(54) LOW GATE-COUNT ENCODING ALGORITHM AND HARDWARE OF FLEXIBLE RATE GLDPC ECC

(71) Applicant: SAMSUNG ELECTRONICS CO., LTD., Suwon-si (KR)

(72) Inventors: Lior Kissos, Tel-Aviv (IL); Yaron Shany, Tel-Aviv (IL); Amit Berman, Tel-Aviv (IL); Ariel Doubchak, Tel-Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/702,048

(22) Filed: Mar. 23, 2022

(51) Int. Cl.
*H03M 13/11* (2006.01)
*H03M 13/00* (2006.01)

(52) U.S. Cl.
CPC ... *H03M 13/1174* (2013.01); *H03M 13/6513* (2013.01)

(58) Field of Classification Search
CPC ............... H03M 13/1174; H03M 13/6513
See application file for complete search history.

(56) References Cited

U.S. PATENT DOCUMENTS

| | | |
|---|---|---|
| 5,920,578 A | 7/1999 | Zook |
| 10,084,481 B2 | 9/2018 | Sommer et al. |
| 11,075,651 B2 * | 7/2021 | Usatyuk ............ H03M 13/1174 |
| 2005/0283709 A1 * | 12/2005 | Kyung ............... H03M 13/6362 714/758 |
| 2020/0220556 A1 * | 7/2020 | Usatyuk ............ H03M 13/1188 |
| 2022/0116057 A1 | 4/2022 | Doubchak et al. |

FOREIGN PATENT DOCUMENTS

| | | |
|---|---|---|
| CN | 107659319 A | 2/2018 |
| EP | 0756385 A2 | 1/1997 |

OTHER PUBLICATIONS

V. Skachek and K. A. S. Immink, "Constant Weight Codes: An Approach Based on Knuth's Balancing Method," in IEEE Journal on Selected Areas in Communications, vol. 32, No. 5, pp. 909-918, May 2014. (Year: 2014).*

(Continued)

*Primary Examiner* — Cynthia Britt
(74) *Attorney, Agent, or Firm* — Sughrue Mion, PLLC

(57) ABSTRACT

Systems, devices, and methods for encoding information bits for storage, including encoding information bits and balance bits to obtain a first bit chunk of a first arrangement; permuting the first bit chunk to obtain a second bit chunk of a second arrangement; encoding the second bit chunk to obtain a third bit chunk of the second arrangement; permuting a first portion of the third bit chunk to obtain a fourth bit chunk of the first arrangement, and encoding the fourth bit chunk to obtain a fifth bit chunk of the first arrangement; permuting a second portion of the third bit chunk, and adjusting the balance bits based on the fifth bit chunk and the permutated second portion of the third bit chunk; adjusting the first arrangement based on the adjusted balance bits, and obtaining a codeword based on the adjusted first arrangement; and transmitting the codeword to a storage device.

20 Claims, 19 Drawing Sheets

(56) References Cited

OTHER PUBLICATIONS

G. Yue, L. Ping and X. Wang, "Generalized Low-Density Parity-Check Codes Based on Hadamard Constraints," in IEEE Transactions on Information Theory, vol. 53, No. 3, pp. 1058-1079, Mar. 2007. (Year: 2007).*

X. He, Y. Liu, B. Wang and Y. Zhang, "Spatially Coupled Generalized LDPC Codes Over Burst Erasure Channels," 2022 IEEE 5th International Conference on Electronic Information and Communication Technology (ICEICT), Hefei, China, 2022, pp. 720-724. (Year: 2022).*

Hu Guanghui et al: "Tail-biting code : A modification to staircase code for high-speed networking", 2015 IEEE Workshop On Signal Processing Systems (SIPS), IEEE, Oct. 14, 2015 (Oct. 14, 2015), 6 pages total, XP032824136, DOI: 10.1109/SIPS.2015.7345028 [retrieved on Dec. 2, 2015].

Communication dated Apr. 14, 2023 by the European Intellectual Property Office in counterpart EP Patent Application No. 23153232.6.

\* cited by examiner

LOW GATE-COUNT ENCODING ALGORITHM AND HARDWARE OF FLEXIBLE RATE GLDPC ECC

BACKGROUND

1. Field

Apparatuses and methods consistent with embodiments relate to managing a storage device, more particularly error correction coding using generalized low-density parity-check (GLDPC) codes.

2. Description of Related Art

GLDPC is an error correction code (ECC) scheme that generalizes both the low-density parity check LDPC code scheme and the product code scheme, or block turbo code scheme. Like these schemes, GLDPC relies on iterative decoding, for example using belief propagation. However, with respect to product code, GLDPC benefits from a better weights distribution, and with respect to LDPC, GLDPC benefits from a stronger decoder, which enhances its probability of error and its convergence speed accordingly.

However, related art GLDPC encoding procedures suffer from a number of problems, including high complexity and restrictive constraints.

For example, a related-art GLDPC encoding procedures suffer from a high computation and memory complexity, for example $(s \cdot (k-p))^2 \sim O(N^2)$, where N is the length of the codeword, s is a number of subcodewords, k is a length of an information word in each subcodeword, and p is a length of parity in each subcodeword.

As another example, a less complex, though non-general related-art GLDPC encoding procedure constrains the codewords to a low code rate (satisfying $$s = \frac{N}{n} \geq n$$

), where n is a length of a subcodeword, as well as requiring the super-codes to be of identical sizes.

SUMMARY

According to embodiments, a storage system includes a storage device configured to store a plurality of generalized low-density parity-check (GLDPC) codewords; at least one processor configured to: obtain information bits, and place the information bits in a first bit chunk included in a first arrangement of a GLDPC codeword; set balance bits included in the first bit chunk to zero; encode the information bits and the balance bits using a systematic code to generate first parity bits, and place the first parity bits in the first bit chunk; permute the first bit chunk to generate first permutated bits, and place the first permutated bits in a second bit chunk included in a second arrangement of the GLDPC codeword; encode the first permutated bits using the systematic code to generate second parity bits, and place the second parity bits in a third bit chunk included in the second arrangement; permute a first portion of the third bit chunk to generate second permutated bits, and place the second permutated bits in a fourth bit chunk included in the first arrangement; encode the second permutated bits using the systematic code to generate third parity bits, and place the third parity bits in a fifth bit chunk included in the first arrangement; permute a second portion of the third bit chunk to generate fourth permutated bits; adjust the first bit chunk by adjusting the balance bits based on a comparison between the fourth bit chunk and the fourth permutated bits, and adjust the fourth bit chunk and the fifth bit chunk based on the adjusted first bit chunk; obtain the GLDPC codeword based on the adjusted first bit chunk, the adjusted fourth bit chunk, and the adjusted fifth bit chunk; and store the GLDPC codeword in the storage device.

According to embodiments, a device for encoding information bits for storage in a storage device includes a memory interface configured to communicate with the storage device; and at least one processor configured to: encode information bits and balance bits using a first coding scheme to obtain a first bit chunk included in a first arrangement of a codeword corresponding to a second coding scheme; permute the first bit chunk to obtain a second bit chunk included in a second arrangement of the codeword corresponding to the second coding scheme; encode bits of the second bit chunk using the first coding scheme to obtain a third bit chunk included in the second arrangement; permute a first portion of the third bit chunk to obtain a fourth bit chunk included in the first arrangement, and encode bits of the fourth bit chunk using the first coding scheme to obtain a fifth bit chunk included in the first arrangement; permute a second portion of the third bit chunk, and adjust the balance bits based on a comparison between the fifth bit chunk and the permutated second portion of the third bit chunk; adjust the first arrangement based on the adjusted balance bits, and obtain the codeword corresponding to the second coding scheme based on the adjusted first arrangement; and control the memory interface to transmit the obtained codeword to the storage device.

According to embodiments, a method of controlling a storage system is executed by at least one processor and includes obtaining information bits, and placing the information bits in a first bit chunk included in a first arrangement of a generalized low-density parity-check (GLDPC) codeword; setting balance bits included in the first bit chunk to zero; encoding the information bits and the balance bits using a systematic code to generate first parity bits, and placing the first parity bits in the first bit chunk; permuting the first bit chunk to generate first permutated bits, and placing the first permutated bits in a second bit chunk included in a second arrangement of the GLDPC codeword; encoding the first permutated bits using the systematic code to generate second parity bits, and placing the second parity bits in a third bit chunk included in the second arrangement; permuting a first portion of the third bit chunk to generate second permutated bits, and placing the second permutated bits in a fourth bit chunk included in the first arrangement; encoding the second permutated bits using the systematic code to generate third parity bits, and placing the third parity bits in a fifth bit chunk included in the first arrangement; permuting a second portion of the third bit chunk to generate fourth permutated bits; adjusting the first bit chunk by adjusting the balance bits based on a comparison between the fourth bit chunk and the fourth permutated bits, and adjusting the fourth bit chunk and the fifth bit chunk based on the adjusted first bit chunk; obtaining the GLDPC codeword based on the adjusted first bit chunk, the adjusted fourth bit chunk, and the adjusted fifth bit chunk; and storing the GLDPC codeword in a storage device.

According to embodiments, a method of encoding information bits for storage in a storage device is executed by at least one processor and includes encoding information bits and balance bits using a first coding scheme to obtain a first bit chunk included in a first arrangement of a codeword corresponding to a second coding scheme; permuting the first bit chunk to obtain a second bit chunk included in a second arrangement of the codeword corresponding to the second coding scheme; encoding bits of the second bit chunk using the first coding scheme to obtain a third bit chunk included in the second arrangement; permuting a first portion of the third bit chunk to obtain a fourth bit chunk included in the first arrangement, and encoding bits of the fourth bit chunk using the first coding scheme to obtain a fifth bit chunk included in the first arrangement; permuting a second portion of the third bit chunk, and adjusting the balance bits based on a comparison between the fifth bit chunk and the permutated second portion of the third bit chunk; adjusting the first arrangement based on the adjusted balance bits, and obtaining the codeword corresponding to the second coding scheme based on the adjusted first arrangement; and transmitting the obtained codeword to the storage device.

DETAILED DESCRIPTION

Embodiments of the present disclosure may relate to a low-complexity method of encoding a GLDPC codeword having supercodes, or arrangements, with a large number of degrees of freedom relative to related-art methods. As discussed above, many related-art GLDPC encoding procedures are burdened by high complexity or very restrictive constraints. Embodiments may relieve the constraints discussed above and enable encoding at practically any rate. This may permit integration of embodiments in products with low ECC redundancy, or high rates, for example embedded MultiMediaCard (eMMC) storage devices. In addition, embodiments may also permit the supercodes, or arrangements, to be of different sizes (s, n), relieving an equal size requirement, for example a requirement that $n_1=n_2$, where $n_1$ represents a number of. This may allow a belief propagation (BP) decoder check node to be strengthened in cases where the equal size requirement would leave it weak. Relieving this constraint may enable extraction of maximal protection from a given budget of redundant bits, improving error probability and convergence speed. Accordingly, embodiments may be useful many storage technologies, for example Universal Flash Storage (UFS) storage devices.

In addition, embodiments may allow the use of any systematic constituent (component) linear block code. When compared to the related-art methods that have similar capabilities, embodiments may benefit from a much smaller complexity, for example O (p·k).

Figure 1:
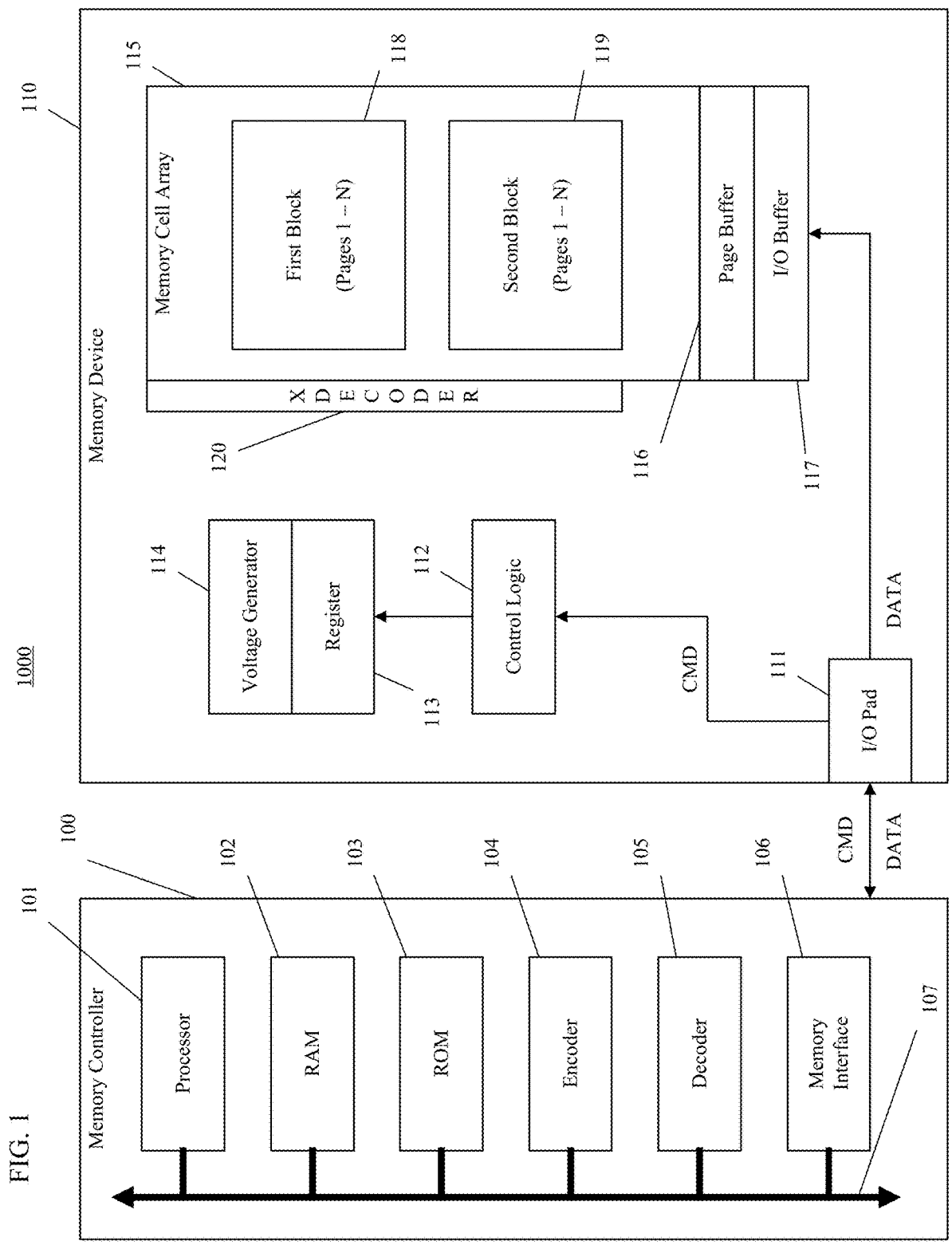
FIG. 1 is a block diagram of a memory system according to embodiments.

FIG. 1 is a block diagram of a memory system according to embodiments of the present disclosure. Referring to FIG. 1, the memory system may include the memory controller 100 and a memory device 110, which may be a nonvolatile memory device.

The memory device 110 may be, but is not limited to, a flash memory device, a NAND flash memory device, a phase change RAM (PRAM), a ferroelectric RAM (FRAM), a magnetic RAM (MRAM), etc. According to embodiments, the memory device 110 may include a plurality of NAND flash memory devices. The memory device 110 may have a planar structure or a three-dimensional (3D) memory cell structure with a stack of memory cells.

The memory device 110 may include a memory cell array 115, an X Decoder 120, a voltage generator 114, an input/output (I/O) buffer 117, a page buffer 116, and a control logic 112 each of which may be implemented as one or more circuits. The memory device 110 may also include an I/O pad 111.

The memory cell array 115 may include a plurality of word lines and a plurality of bit lines. Each memory cell of the memory cell array 115 may be implemented as a nonvolatile memory cell. For example, each memory cell of the memory cell array 115 may have, for example, a floating gate or a charge storage layer such as a charge trapping layer.

The memory cell array 115 may include a plurality of blocks and a plurality of pages. Each block may include a plurality of pages. For example, a first block 118 may include a first plurality of pages 1-N while a second block 119 may include a second plurality of pages 1-N, where N is an integer greater than 1. A page may be a unit of program and read operations, and a block may be a unit of erase operation.

The control logic 112 may control the overall operation of the memory device 110. When receiving a command CMD from the memory controller 100, the control logic 112 may interpret the command CMD and control the memory device 110 to perform an operation (e.g., a program operation, a read operation, a read retry operation, or an erase operation) according to the interpreted command CMD.

The X Decoder 120 may be controlled by the control logic 112 and drive at least one of the word lines in the memory cell array 115 according to a row address.

The voltage generator 114 may be controlled by the control logic 112 to generate one or more voltages required for a program operation, a read operation or an erase operation and provide the generated voltages to one or more rows selected by the X Decoder 120.

The page buffer 116 may be controlled by the control logic 112 and operate as a sense amplifier or a write driver according to an operation mode (e.g., a read operation or a program operation).

The I/O pad 111 and the I/O buffer 117 may serve as I/O paths of data exchanged between an external device, e.g., the memory controller 100 or a host and the memory device 110.

The memory controller 100 may include a processor 101, a read-only memory (ROM) 103, a random access memory (RAM) 102, an encoder 104, a decoder 105, a memory interface 106, and a bus 107. The elements 101 through 106 of the memory controller 100 may be electrically connected to each other through the bus 107.

The processor 101 may control the overall operation of the memory system including the memory controller 100. The processor 101 may include a circuit that controls other elements by generating control signals. When power is supplied to the memory system, the processor 101 may drive a firmware (e.g., stored in the ROM 103) for operating the memory system on the RAM 102, thereby controlling the overall operation of the memory system. According to embodiments, the processor 101 may also issue instructions for controlling operations of other elements of the memory controller 100 including, for example, some or all of the ROM 103, RAM 102, encoder 104, decoder 105, memory interface 106, and a bus 107. According to embodiments, any operations described herein as being performed by the memory controller 100 may be performed by, or under the control of, the processor 101. According to embodiments, any operations described herein as being performed by the memory controller 100 may be performed by, or under the control of, the processor 101 executing instructions that correspond to the operations and are included in program code (e.g., stored in the ROM 103).

A driving firmware code of the memory system may be stored in the ROM 103, however embodiments are not limited thereto. The firmware code can also be stored in a portion of the memory device 110. Therefore, the control or intervention of the processor 101 may encompass not only the direct control of the processor 101 but also the intervention of firmware which is software driven by the processor 101.

The RAM 102, which may include a memory serving as a buffer, may store an initial command, data, and various variables input from a host or the processor 101, or data output from the memory device 110. The RAM 102 may store data and various parameters and variables input to and output from the memory device 110.

The memory interface 106 may serve as an interface between the memory controller 100 and the memory device 110. The memory interface 106 is connected to the I/O pad 111 of the memory device 110 and may exchange data with the I/O pad 111. In addition, the memory interface 106 may create a command suitable for the memory device 110 and provide the created command to the I/O pad 111 of the memory device 110. The memory interface 106 provides a command to be executed by the memory device 110 and an address ADD of the memory device 110.

According to embodiments, the decoder 105 may be an error correcting code (ECC) decoder configured to decode data in the manner described above, and the encoder 104 may be an ECC encoder configured to encode data in the manner described above. According to embodiments, the decoder 105 and the encoder 104 may perform error bit correction in the manner described above. The encoder 104 may generate data added with one or more parity and/or redundancy bits by performing error correction encoding on data before the data is provided to the memory device 110. The one or more parity and/or redundancy bits may be stored in the memory device 110.

The decoder 105 may perform error correction decoding on output data, determine whether the error correction decoding is successful based on the result of the error correction decoding, and output an instruction signal based on the determination result. Read data may be transmitted to the decoder 105, and the decoder 105 may correct error bits of the data using the one or more parity and/or redundancy bits.

In embodiments, encoder 104 and decoder 105 may be configured to encode and decode data including GLDPC codewords. A GLDPC codeword is a binary word having a length N which is composed of shorter codewords, which may be referred to as subcodewords, encoded with block encoding scheme which may be referred to as a component code, or constituent code. The constituent code may be a linear block code, for example a Reed-Muller code, a Bose-Chaudhuri-Hocquenghem (BCH) code, a Hadamard code, or a Hamming code.

Figure 2:
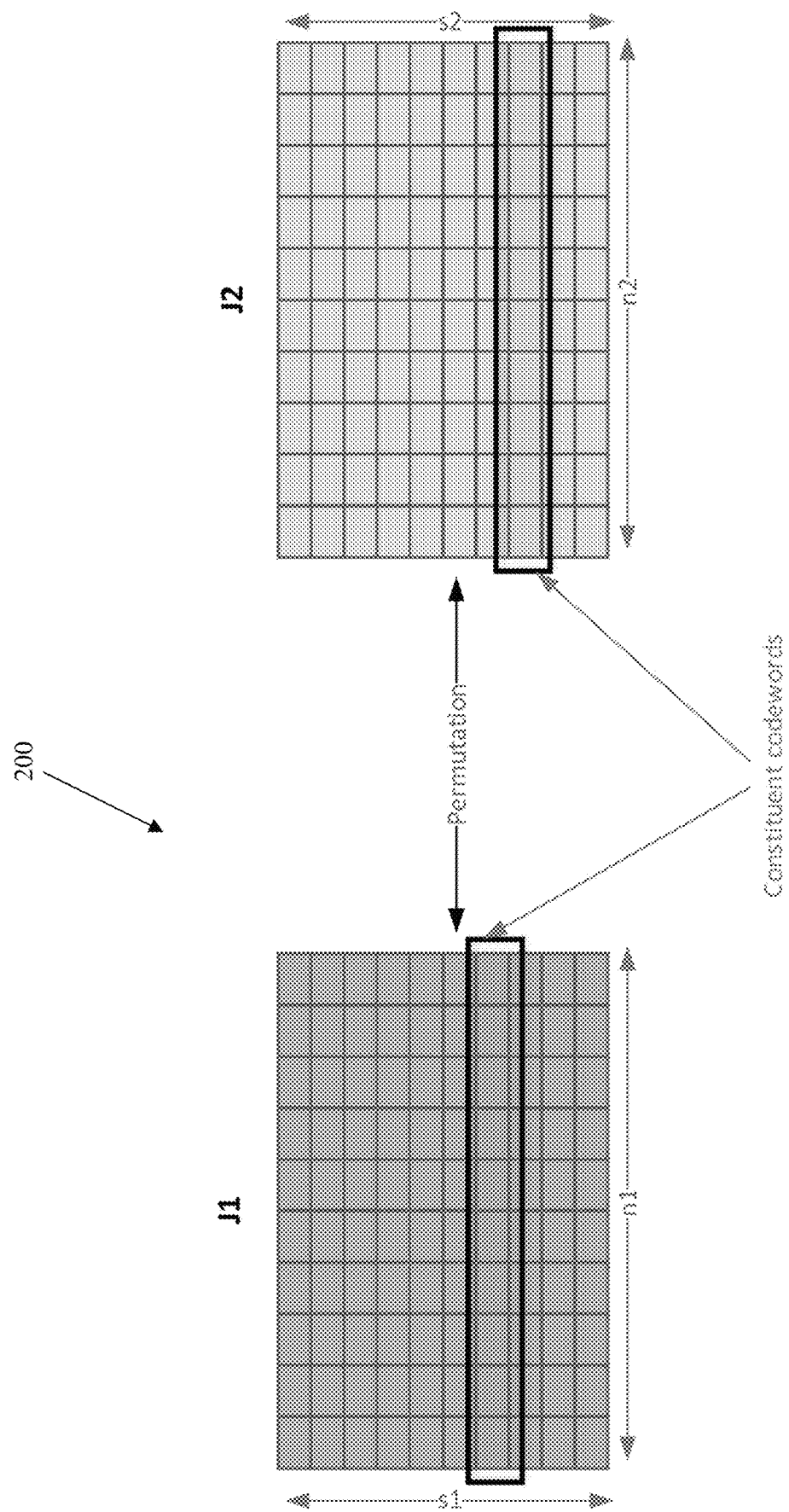
FIG. 2 illustrates an example of a GLDPC codeword 200, according to embodiments.

FIG. 2 illustrates an example of a GLDPC codeword 200, according to embodiments. Each GLDPC codeword may have $J \geq 2$ different arrangements with a known bijective arbitrary mapping, or permutation, transforming between them. As a result, every bit of the GLDPC codeword 200 may belong simultaneously to J subcodewords; one in every arrangement. As shown in FIG. 2, the GLDPC codeword 200 may be represented in two arrangements, for example arrangement $J_1$ and arrangement $J_2$. Each of arrangement $J_1$ and arrangement $J_2$ may be an s×n matrix whose rows are subcodewords. GLDPC codeword 200 satisfies a basic relation shown in Equation 1 below:

$$N = s_1 \cdot n_1 = \ldots = s_j \cdot n_j \qquad \text{(Equation 1)}$$

where n represents a length of each subcodeword, and s represents a number of the subcodewords. In embodiments, it may be possible that a subcodeword of one arrangement is of a different size than a subcodeword of another arrangement. In other words, it may be possible that that $s_1 \neq s_2$, $n_1 \neq n_2$, where $s_1$ represents a number of subcodewords in first arrangement, $n_1$ represents a length of a subcodeword in the first arrangement, $s_2$ represents a number of subcodewords in second arrangement, and $n_2$ represents a length of a subcodeword in the second arrangement. Further, although FIG. 2 illustrates an example in which J=2, embodiments are not limited thereto.

A GLDPC codeword may contain bits of several types. For example, information bits may be pure information bits as viewed by a GLDPC ECC. Parity bits may be constituent redundant bits resulting from the encoding in the two arrangements. Balancing bits may be used by embodiments to overcome a certain problem within the encoding procedure, as explained in greater detail below. Cyclic-redundancy-check (CRC) parity bits may be used to reduce an undetected error probability. In embodiments, CRC parity bits may be omitted. Shortening bits may be padding bits placed in the GLDPC arrangements in order to satisfy layout constraints. Shortening bits are not written to memory, but may be a virtual part of the matrices and may be considered to have a known value by the encoder and decoder, for example a value of 0. Unused bits may be parity bits that are not used. In embodiments, unused bits may be written to memory. In some embodiments, unused bits may have any known value, for example all having a value of 0, or all having a value of 1. In other embodiments, unused bits may have the value of the first $1_{unused}$ info bits. This may be chosen to considerations other than decoding performance, for example wear on a memory device that may be caused by frequent changes related to the unused bits. In embodiments, parity bits, balancing bits, CRC parity bits, and unused bits may be included in the redundant bits budget.

Parameters involved with the structure of GLDPC codes, for example the matrix sizes (s×n) and those of their subsets, may be determined by a number of constraints. For example, for a given $I_0$, which may represent a number of pure information bits to be encoded, and a given $P_0$, which may represent a number of non-information bits allowed by a non-information bits budget, an encoding and decoding system according to embodiments may specify that $I_0 = I_{data} +$ $I_{meta}+I_{vss}+I_{NCRC}$, may specify that $N_0=I_0+P_0$, may specify that $N=N_0+sh_{total}$, where $sh_{total}$ represents a total number of shortening bits, and may specify that an overhead $$OH = \frac{P_0}{I_0}.$$

In addition, a particular constituent code according to embodiments, for example an extended Hamming code, may specify that $n=2^m-short$, where short represents a number of shortening bits in an information word of each subcodeword, may specify that $p=m+1$, where p represents a length of parity in each subcodeword of the constituent code, and may specify that $k=2^m-m-1-short=n-p$, where k represents a length of an information word in each subcodeword.

In addition, a GLDPC scheme according to embodiments may specify that $N=s_1 \cdot n_1=s_2 \cdot n_2$, and that $P_{code}=s_1 \cdot p_1+s_2 \cdot p_2+l_{cop}$, where $l_{cop}$ represents a length of a check-on-checks chunk. Further, a GLDPC encoding scheme according to embodiments may specify that $l_{bal}=l_{cop}-1$, where $l_{bal}$ represents a length of balance bits included in the GLDPC codeword, may specify that $l_{cop}=(s_1-t_1) \cdot p_1$, where $t_1$ represents a number of subcodewords in an information bit chunk of a first arrangement, for example arrangement $J_1$, and may specify that $P_0=P_{code}+l_{bal}+l_{slack}$, where $l_{slack}=l_{CRC}+l_{unused}$, and where $l_{CRC}$ represents a length of cyclic redundancy check bits, and $l_{unused}$ represents a length of unused bits.

In embodiments, out of the possible configurations filtered by those constraints, a single configuration may be selected based on the following:

Minimization of subcodeword length, n, through shortening:
This may optimize the operation of the Belief-Propagation based decoder, by distributing a given information (protection) level delivered by the constituent codeword on an effectively reduced number of vulnerable bits.

Minimization of the number unused bits: Unused bits may be part of the redundant bits budget and may be, for example, part of the information that is written to a storage, but unused bits do not carry any information nor code protection.

FIGS. 3A-3B and 4A-4B illustrate two examples of partitioning schemes which may be used to partition an arrangement $J_1$ and an arrangement $J_2$ into partitions, which may be referred to as zones or bit chunks.

Figure 3B:
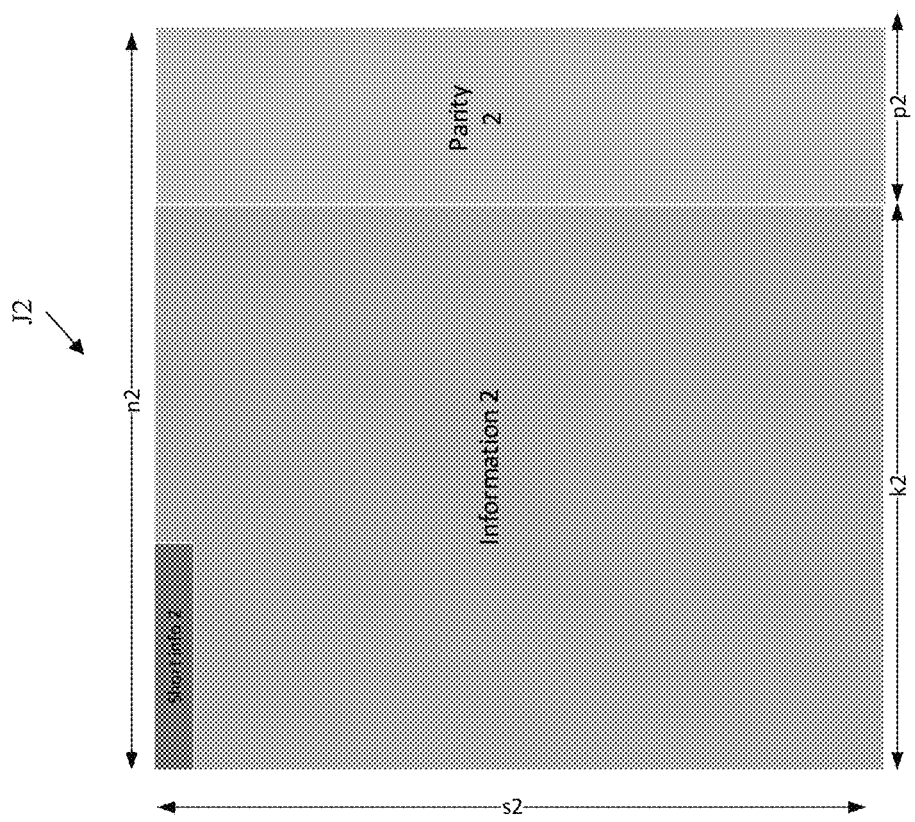
FIGS. 3A-3B and 4A-4B illustrate examples of partitioning schemes, according to embodiments.
Figure 3A:
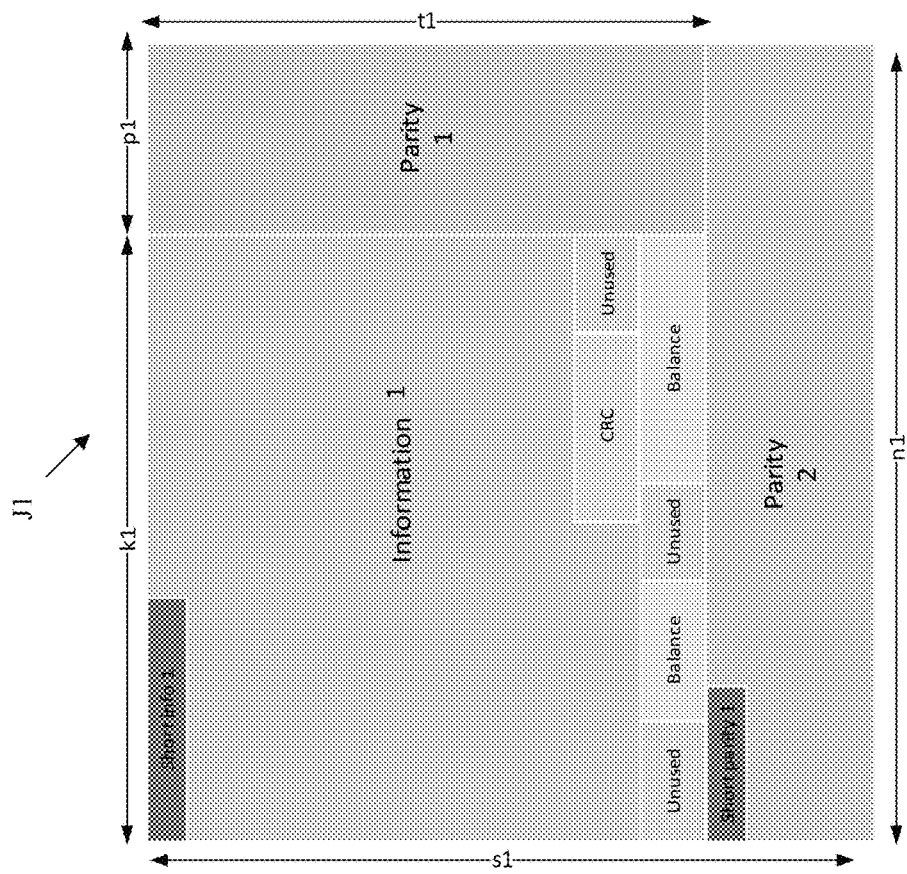

FIGS. 3A-3B are block diagrams of arrangement $J_1$ and arrangement $J_2$ corresponding to a GLDC code, according to embodiments. As illustrated in FIGS. 3A-3B, arrangement $J_1$ and arrangement $J_2$ may be divided or partitioned into zones or bit chunks based on a purpose of the bits included in the zones or bit chunks.

In embodiments, arrangement $J_1$ may include, for example, a bit chunk Information 1, which may include information bits, a bit chunk Parity 1, which may include parity bits, a bit chunk Parity 2, which may include parity bits, a bit chunk CRC which may include CRC bits, one or more bit chunks Balance, which may include balance bits, and one or more bit chunks Unused, which may include unused bits. In addition, arrangement $J_1$ may include a bit chunk Short info 1 which may include shortened bits, and a bit chunk Short parity 1 which may include parity bits.

In embodiments, arrangement $J_2$ may include a bit chunk Information 2, which may include information bits, a bit chunk Parity 2, which may include parity bits, and a bit chunk Short info 2, which may include shortened bits.

In embodiments, the parity bits included in bit chunk Parity 1 and bit chunk Parity 2 may be the result of the systematic encoding of $J_1$ and subsequently $J_2$. The balance bits, CRC bits and unused bits may be an interleaved mixture of bits spread across the last rows of the bit chunk Information 1 following a priority order below (rightmost bottom to leftmost top):
1. Balance
2. Unused
3. CRC
4. Info The balance bits ordering may depend on the chosen permutation. Moreover, they may not be guaranteed to be ordered continuously, but the unused bits may be sufficient in covering the spaces between them, resulting in continuous CRC and information bit sequences.

In embodiments, the bits of bit chunk Information 2 may be not identical to the bits of bit chunk Information 1. Instead, the bit chunk Information 2 may correspond to bits of bit chunk Information 1 bits and also bits having other roles including the bits of bit chunk Parity 1, the bits of the bits chunks Balancing and the bits of the bit chunk CRC. The bits of the bit chunk Short info 1 may be spread all across the bit chunk Information 2, depending on the permutation.

Figure 4B:
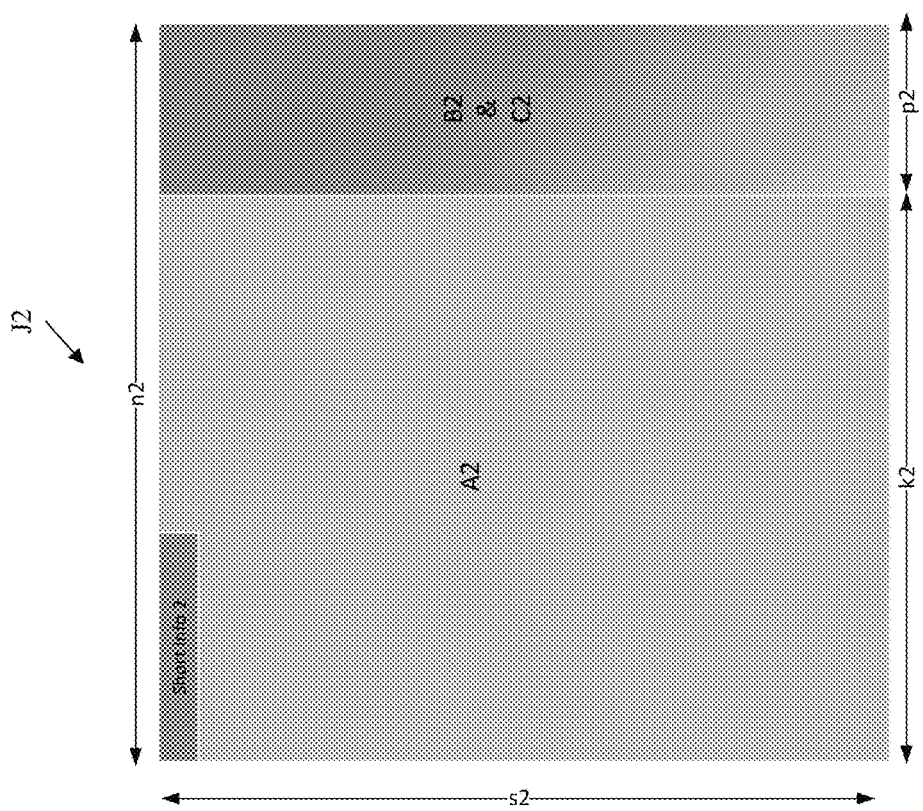
Figure 4A:
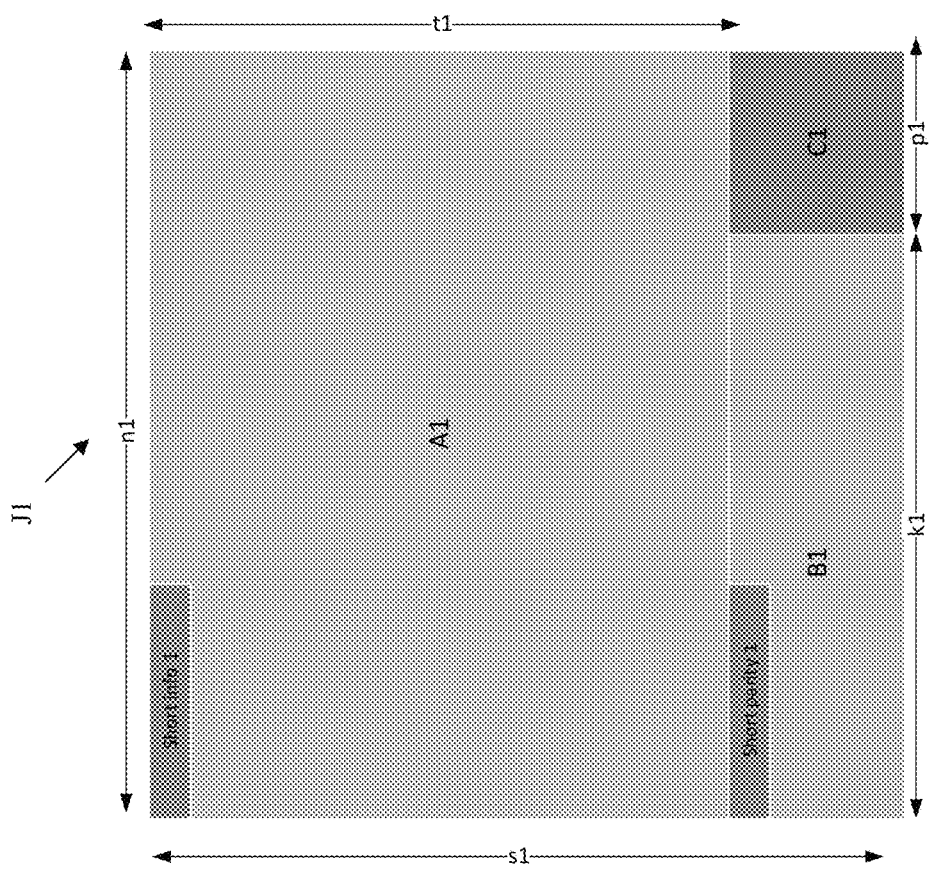

FIGS. 4A-4B illustrate a partitioning scheme in which arrangement $J_1$ and arrangement $J_2$ are partitioned for permutation reasons. In particular, FIG. 4A illustrates arrangement A partitioned according to permutation constraints of the bits of arrangement $J_1$, and FIG. 4B illustrates arrangement $J_2$ partitioned according to permutation constraints of the bits of arrangement $J_2$, according to embodiments.

In embodiments, arrangement $J_1$ may include a bit chunk $A_1$, a bit chunk $B_1$, and a bit chunk $C_1$, and arrangement $J_2$ may include a bit chunk $A_2$, a bit chunk $B_2$, and a bit chunk $C_2$. In addition, arrangement $J_1$ may include the bit chunks Short info 1 and Short parity 1 of FIG. 3A, and arrangement $J_2$ may include the bit chunk Short info 2 of FIG. 3B.

In embodiments, specific bit chunks from arrangement $J_1$ and arrangement $J_2$ may be constrained to exchange bits exclusively with each other, thus limiting the size of the ensemble of possible permutations. However, these "sub-permutations", or permutations within the specific bit chunks, may be arbitrary within their boundaries;

For example, in embodiments a GLDPC permutations ensemble, regardless of the actual permutation, may require that bit chunk $A_1$ exchanges all its bits with all those of bit chunk $A_2$ following an arbitrary permutation ($\pi$), may require that bit chunk $B_1$ exchanges all its bits with all those of bit chunk $B_2$, and may require that bit chunk $C_1$ exchanges all its bits with all those of bit chunk $C_2$, as represented in Equations 2-4 below:

$$\pi_{1 \to 2}(A_1)=A_2 \Leftrightarrow \pi_{2 \to 1}(A_2)=A_1 \quad \text{(Equation 2)}$$

$$\pi_{1 \to 2}(B_1)=B_2 \Leftrightarrow \pi_{2 \to 1}(B_2)=B_1 \quad \text{(Equation 3)}$$

$$\pi_{1 \to 2}(C_1)=C_2 \Leftrightarrow \pi_{2 \to 1}(C_2)=C_1 \quad \text{(Equation 4)}$$

In embodiments, $B_2$ and $C_2$ may share the same initial bits "reservoir", which may be referred to as bit chunk $BC_2$, and the partition between the two may be arbitrary.

The three permutations above may be independent of each other in principle. In embodiments, the "shortening" bit chunks do not participate in the exchange. In embodiments, the corresponding chunks excluding the "shortenings" may be identical in area. The bit roles, as discussed above, may not necessarily coincide with the chunk exchange partitioning.

FIGS. 5A-5B, 6A-6B, 7A-7B, 8A-8B, 9A-9B, 10A-10B, 11A-11B, 12A-12B, 13, and 14A-14B illustrate examples of arrangement $J_1$ and arrangement $J_2$ at various stages of an encoding process, according to embodiments. In embodiments, some or all of the encoding process or encoding processes described with respect to FIGS. 5A-14B may be performed by memory system 1000 or a component of memory system 1000, for example memory controller 100 or encoder 104.

At a beginning of the encoding process, the following parameters may be known:

Block Encoding : G z,? , parity part of constituent code generating matrix including shortening. All following block encoding operation may be calculation of only the "parity" part, as the "systematic" part is identical by definition.

Dimensions parameters:
  constituent code parameters: p, n, k, short
  number of rows: s Permutation parameters: $ind_A$, $ind_B$, $ind_C$, permutation matrices for corresponding bit chunks Balancing parameters:
  Indices of balancing bits within arrangement $$J_1: \underset{1 \times (l_{cop}-1)}{Ind_{Bal}}$$

Balancing matrix:

$$\underset{(l_{cop}-1) \times (l_{cop}-1)}{T_{Bal}^{-1}}$$

Balance to BC transfer matrix:

$$\underset{(l_{bal}+b_{rows} \cdot p) \times (s \cdot p)}{T_{bal \to BC_1}}$$

Figure 5B:
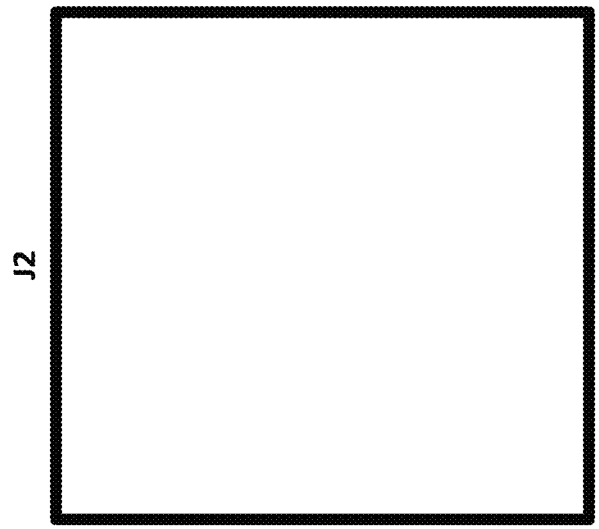
FIGS. 5A-5B, 6A-6B, 7A-7B, 8A-8B, 9A-9B, 10A-10B, 11A-11B, 12A-12B, 13, and 14A-14B illustrate examples of a GLPDC codeword at various stages of an encoding process, according to embodiments.
Figure 5A:
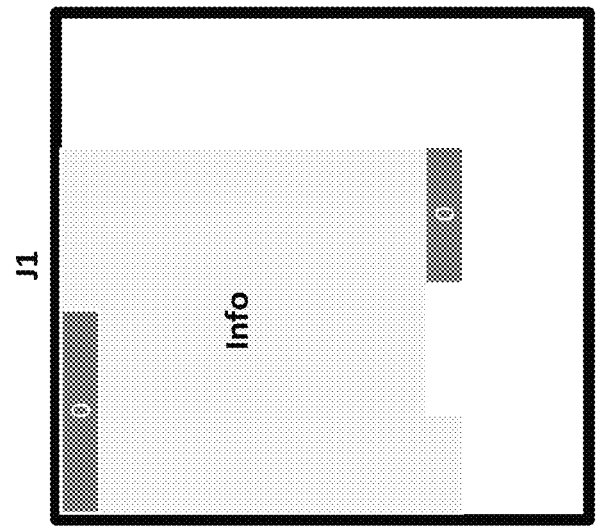

As illustrated in FIGS. 5A-5B, at a beginning of an encoding procedure according to embodiments, the information bits may be obtained, and may be placed in the bit chunk Information 1. In FIG. 5A the information bits may be labeled Info. In addition, the bits of $ind_{Bal}$, $ind_{short}$ may be set to 0, and the bits of $ind_{unused}$ may be set to the values of the first $1_{unused}$ information bits. The bits of $ind_{CRC}$ may be left blank.

Figure 6A:
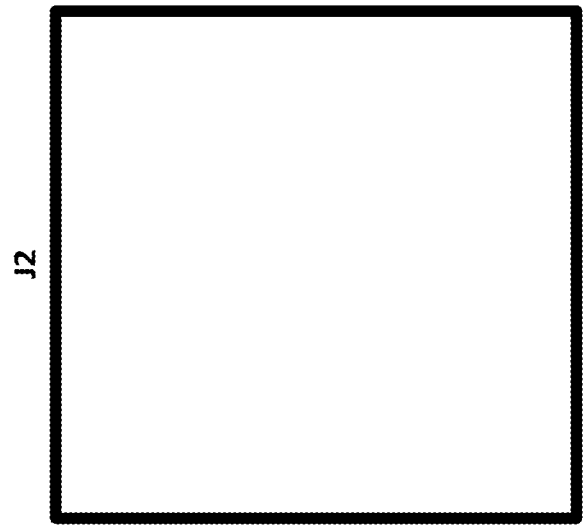
Figure 6B:
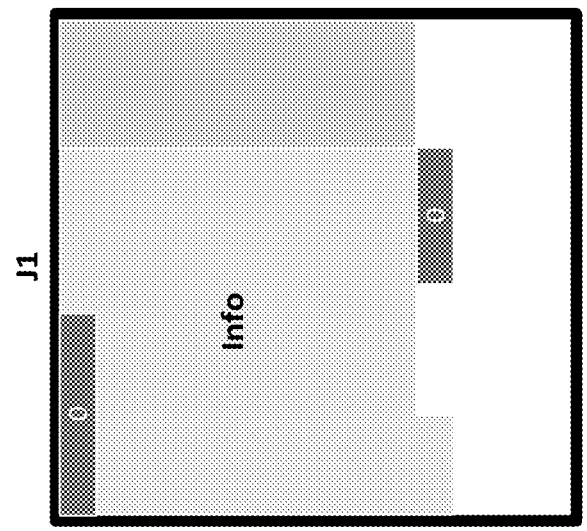

As illustrated in FIGS. 6A-6B, $\tilde{I}$ may be block encoded to generate $\tilde{A}_1$, by calculating $$\underset{t \times n}{\tilde{A}_1} = \underset{t \times k}{\tilde{I}} \cdot \underset{k \times n}{G}.$$

In this step, I may correspond to the information bits, for example bit chunk Information 1, $I_{bal}$ may correspond to bit chunk Balance, and $I_{CRC}$ may correspond to bit chunk CRC. Further, $\tilde{I}$ may be equal to I\{rows with $I_{Bal}$, $I_{CRC}$\}. This block encoding may be done row by row.

Figure 7A:
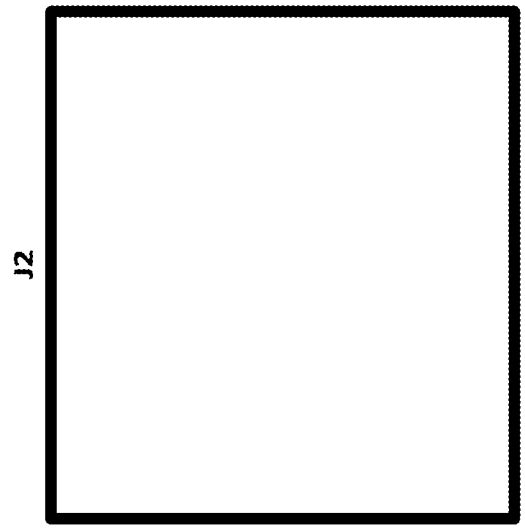
Figure 7B:
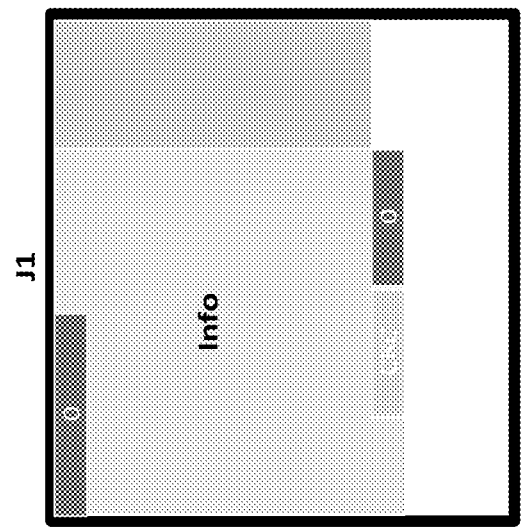

As illustrated in FIGS. 7A-7B, the CRC bits may be determined by calculating $$I_{CRC} = \frac{\tilde{A}_1}{g_{CRC}},$$

and the bit chunk CRC may be filled by setting $J_1[ind_{CRC}] = I_{CRC}$.

Figure 8A:
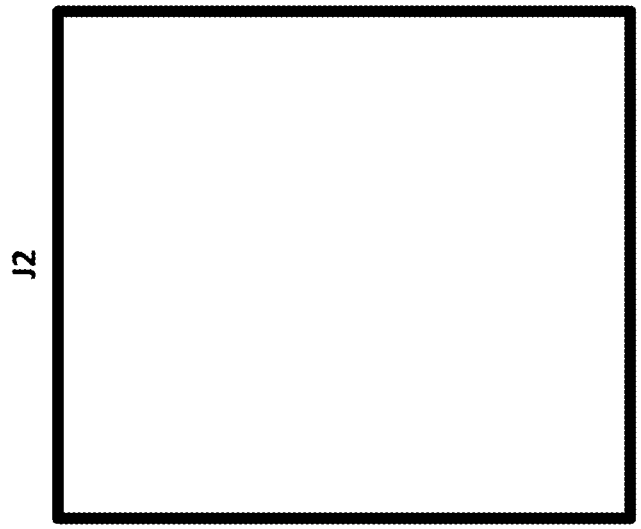
Figure 8B:
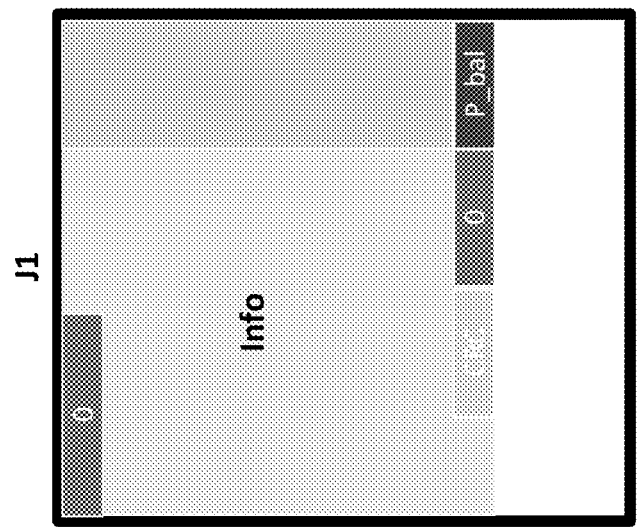

As illustrated in FIGS. 8A-8B, the block encoding of bit chunk $A_1$ may be completed by block encoding I to generate $A_1$ by calculating $A_1 = I \cdot G$, where $I = \tilde{I}\tilde{I}$. This block encoding may generate an initial $P_{bal}$, which may be parity bits of bit chunk Parity 1 which are influenced by $I_{bal}$, and which may be referred to as parity balance bits. The initial $P_{bal}$ may be saved for a later step.

Figure 9A:
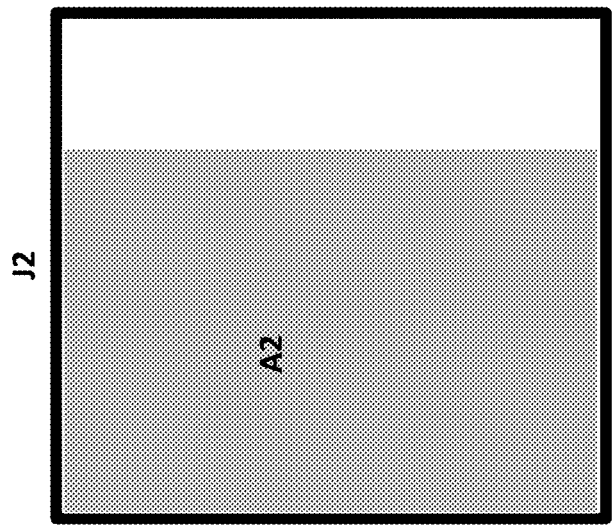
Figure 9B:
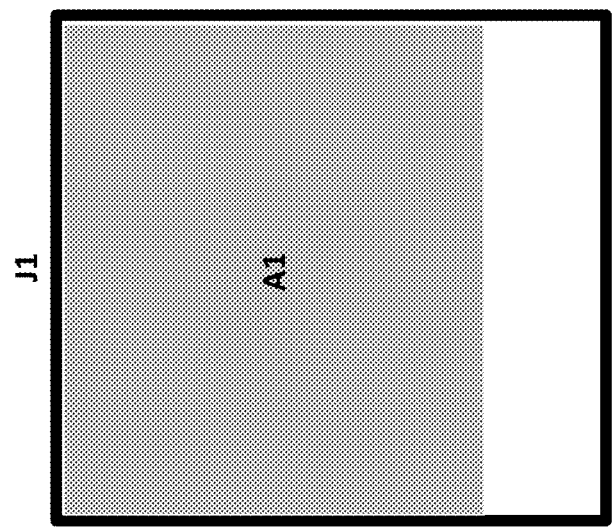

As illustrated in FIGS. 9A-9B, bit chunk $A_1$ may then be permuted to obtain bit chunk $A_2$ by calculating $A_2 = \pi_{1 \to 2}(A_1)$.

Figure 10B:
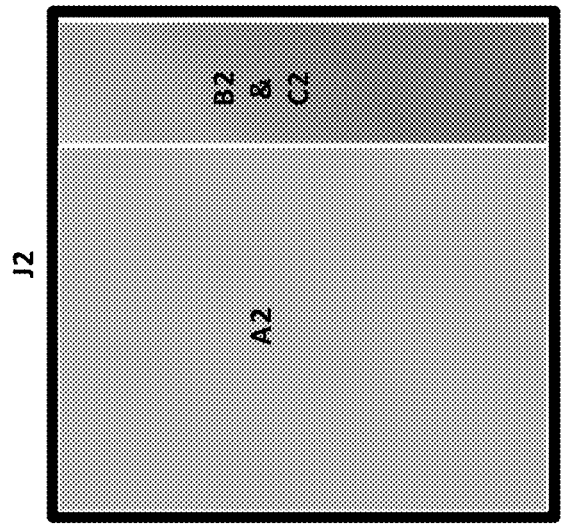
Figure 10A:
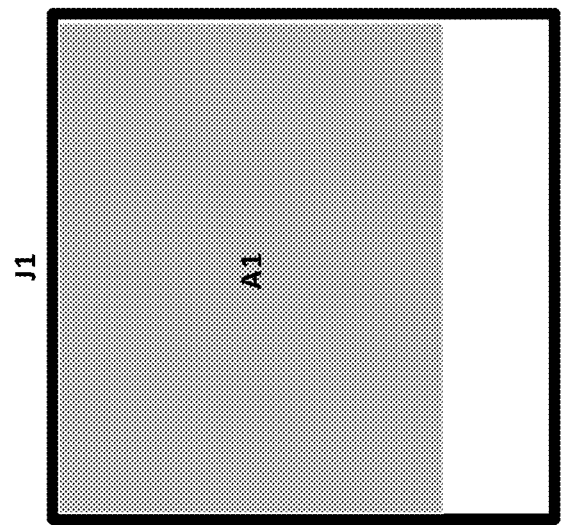

As illustrated in FIGS. 10A-10B, $A_2$ may be block encoded to obtain arrangement $J_2$ by calculating $$\underset{s \times n}{J_2} = \underset{s \times k}{A_2} \cdot \underset{k \times n}{G}.$$

Then, bit chunk $BC_2$ may be divided into bit chunk $B_2$ and bit chunk $C_2$ using $B_2 = J_2[ind_{B_2}]$, $C_2 = J_2[ind_{C_2}]$. Although it is described herein that $J_1$ and $J_2$ use the same block encoding matrix G, embodiments are not limited to. In embodiments, $J_1$ and $J_2$ could use different block encoding matrices corresponding to a same type of constituent code, or different block encoding matrices corresponding to different types of constituent codes.

Figure 11B:
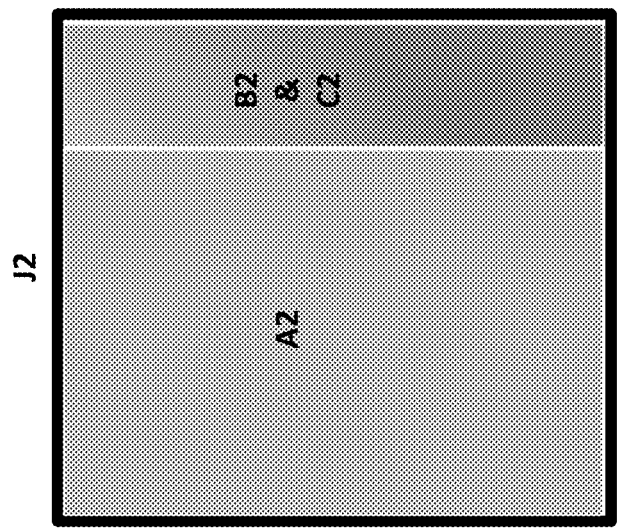
Figure 11A:
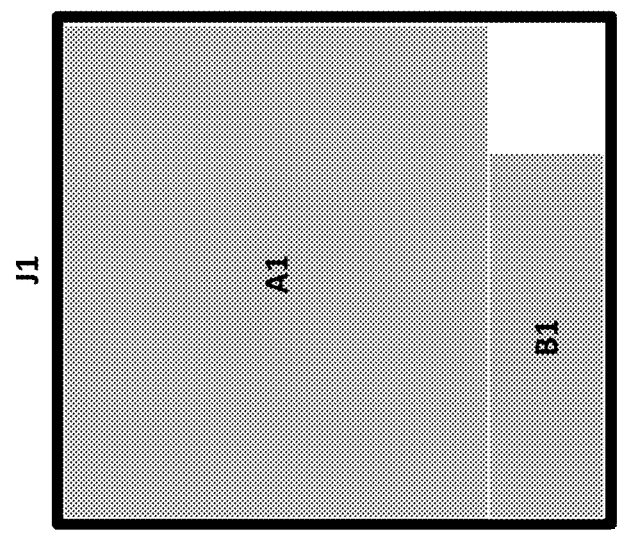

As illustrated in FIGS. 11A-11B, bit chunk $B_2$ may be permuted to obtain an initial bit chunk $B_1$ by calculating $B_1 = \pi_{2 \to 1}(B_2)$. Initial bit chunk $B_1$ may be saved for a later step, for example a second round of encoding.

Figure 12B:
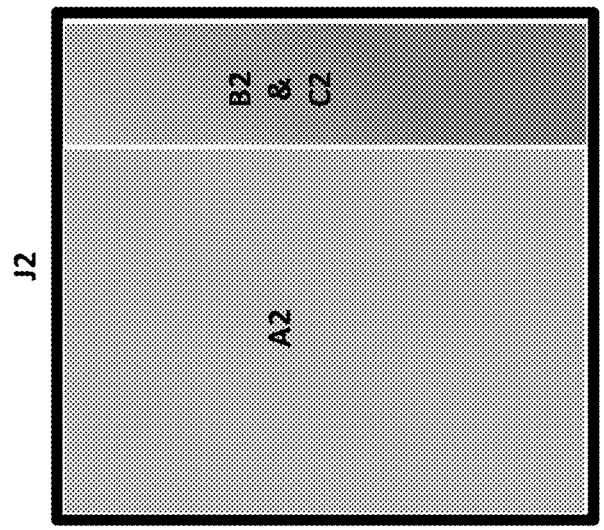
Figure 12A:
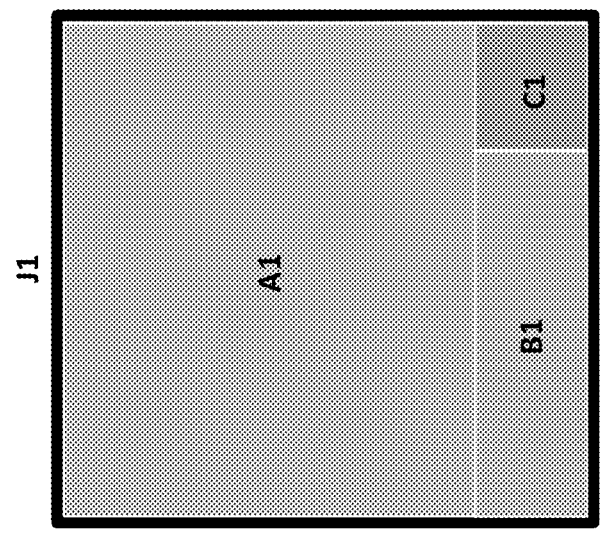

As illustrated in FIGS. 12A-12B, initial bit chunk $B_1$ may be block encoded to generate bit chunk $BC_1$ by calculating $$\underset{(s-t) \times n}{BC_1} = \underset{(s-t) \times k}{B_1} \cdot \underset{k \times n}{G}.$$

This block encoding may generate an initial bit chunk $C_1$, which may be saved for a later step, for example a second round of encoding.

In embodiments, encoding procedure described above with respect to FIGS. 5A-12B may be referred to as a first round of the encoding procedure, and the encoding procedure described below with respect to FIGS. 13-14B may be referred to as a second round of the encoding procedure.

Figure 13:
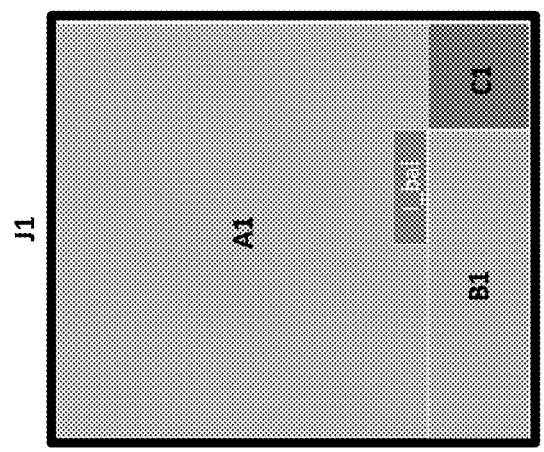
Figure 14B:
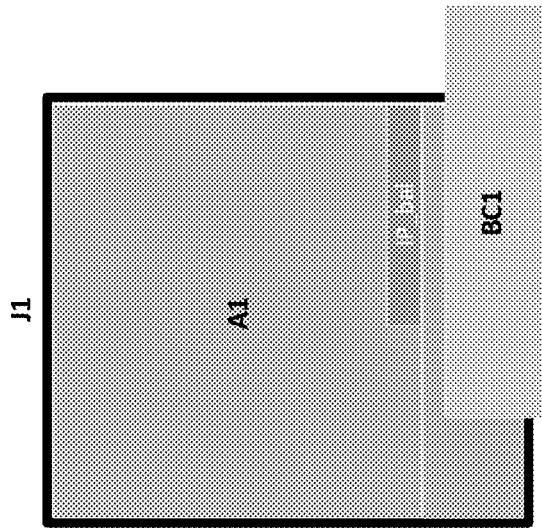

As illustrated in FIG. 13, the balance bits may be adjusted. First, a difference may be determined between the initial bit chunk $C_1$ determined above, and a result of a permutation of bit chunk $C_2$. For example, the permuted $C_2$ may be superposed onto the initial $C_1$ using binary addition according to Equation 5 below:

$$P = C_1 + \pi_{2 \to 1}(C_2) \qquad \text{(Equation 5)}$$

Then, the adjusted balance bits may be calculated using Equation 6 below:

$$\underset{1 \times (l_{cop}-1)}{I_{Bal}} = \underset{1 \times (l_{cop}-1)}{P} \cdot \underset{(l_{cop}-1) \times (l_{cop}-1)}{T_{Bal}^{-1}} \qquad \text{(Equation 6)}$$

Finally, the balance bits of arrangement $J_1$, which were initially set to zero, may be adjusted by placing $I_{bal}$ in arrangement $J_1$ using $J_1 [ind_{Bal}] = I_{Bal}$.

Figure 14A:
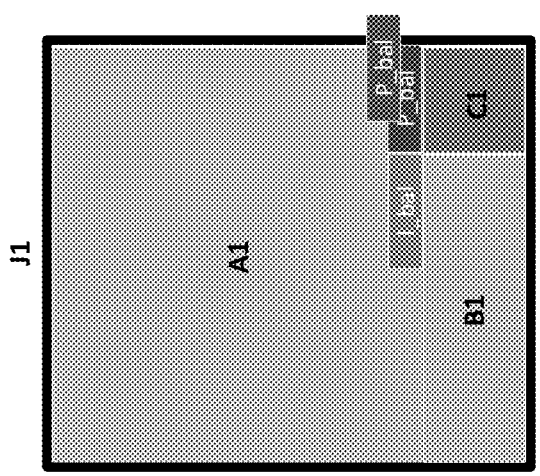

Then, as illustrated in FIG. 14A, the contribution of $I_{bal}$ to $P_{bal}$ may be determined, and that contribution may be added to the initial $P_{bal}$ determined above to adjust $P_{bal}$. After $P_{bal}$, is adjusted, $I_{bal}$ and $P_{bal}$ may then be combined into $IP_{bal}$, and the contribution of $IP_{bal}$ to bit chunk $BC_1$ may be determined in order to adjust the initial bit chunk $B_1$ and bit chunk $C_1$ determined above. Once the bit chunk $B_1$ and the bit chunk $C_1$ are adjusted, the encoding process may be complete.

An example of a procedure for determining the contribution of $I_{bal}$ to $P_{bal}$, and the contribution of $IP_{bal}$ to bit chunk $BC_1$, is described in detail below.

A basic requirement may be that the J=2 arrangements be identical up to permutation. However, the first round of the encoding procedure described above cannot guarantee that, and in principle $C_1 \ne \pi_{2 \to 1}(C_2)$. Therefore, some preliminary actions may be taken.

The encoding procedure described above may be a succession of matrix multiplications and permutations; both are linear operations. This means that they can be described as an equivalent single linear operation whose "input" is the Info chunk (flattened) and its outputs are arrangement $J_1$, arrangement $J_2$ any of their subsets or their linear combinations (flattened), hereby treated as "output". For example $$\underset{1 \times s \cdot n}{J_1} = \underset{1 \times t \cdot k}{I} \cdot \underset{t \cdot k \times s \cdot n}{T}.$$

This linearity holds also for $J_2$ or subsets of $J_1$ and $J_2$.

In addition, for any "output" of some length, we may find a subset of I, an "input", of identical length that is tied to that "output" through a reversible linear transform.

The flattened Check-On-Parity (CoP) chunks, for example bit chunk $C_1$ and bit chunk $C_2$, may have a length of $l_{cop}$=p·(s−t). As discussed above, these may be considered "outputs" of the encoding procedure discussed above. Moreover, their subtraction can be considered an "output" as well, as shown in Equation 7 below:

$$\underset{1 \times l_{cop}}{P} = \underset{1 \times l_{cop}}{C_1} + \pi_{2 \to 1}\left(\underset{1 \times l_{cop}}{C_2}\right) \qquad \text{(Equation 7)}$$

Where $\pi_{2 \to 1}(C_2)$ are bits of bit chunk $C_2$ in arrangement $J_2$ but permuted to arrangement $J_1$.

Because any GLDPC codeword has an information chunk that is larger than that, a subset can be found, $I_{Bal} \subset I$, which satisfies the reversible relation given in Equation 8 below:

$$\underset{1 \times l_{cop}}{P} = \underset{1 \times l_{cop}}{I_{Bal}} \cdot \underset{l_{cop} \times l_{cop}}{T_{Bal}} \qquad \text{(Equation 8)}$$

The remaining info bits, $I_{NoBal} = I \setminus I_{bal}$ are also affecting P independently of $I_{bal}$ in a linear but non-reversible way. From the principle of superposition, as shown in Equation 9 below:

$$I_{Bal} \cdot T_{Bal} + I_{NoBal} \cdot T_{NoBal} = P_{Bal} + P_{NoBal} = P \qquad \text{(Equation 9)}$$

The demand for $C_1 = \pi_{2 \to 1}(C_2)$ can be seen to be equivalent to P=0, that is equivalent to: $I_{Bal} \cdot T_{Bal} = I_{NoBal} \cdot T_{NoBal}$ Therefore, by sacrificing few bits of the total parity budget, the $I_{bal}$ bits according to Equation 10 below:

$$I_{Bal} = (I_{NoBal} \cdot T_{NoBal}) \cdot T_{Bal}^{-1} \qquad \text{(Equation 10)}$$

The effect of $I_{NoBal}$ can be compensated such that $P_{Bal} = P_{NoBal} \Rightarrow P = 0$.

$T_{bal}$ represents the reversible effect of the $l_{cop}$ bits within the info chunk on the $l_{cop}$ bits of CoP chunk. In embodiments, $T_{bal}$ may be constructed using the following procedure:

Initialize:
$ind_{running} = l_{info} - 1$ (last [lowermost right] bit of the info chunk)
$cnt_{bal} = 0$ $$\underset{cnt_{bal} \times l_{cop}}{T_{bal,acc}} = \text{empty}$$

Repeat the following steps:
1. Zeroise the info chunk
2. Set '1' on bit $ind_{running}$
3. Fully encode
4. Extract $C_1$, $C_2$ and compute $$\underset{1 \times l_{cop}}{P}$$

5. Test linear dependency of P on current $$\underset{cnt_{bal} \times l_{cop}}{T_{bal,acc}} :$$

if independent,
  Append P to $T_{bal,acc}$
  Increase $cnt_{bal}$ by 1
6. If $cnt_{bal} = l_{bal}$, Terminate. Else, decrease $ind_{running}$ by 1 and return to step 1

The parity of the CoP sequence is always even; it has an even Hamming weight. Therefore, the last bit's value depends on the all its $l_{cop}-1$ predecessors. Thus, the true length of $I_{Bal}$ and the dimensions of $T_{Bal}$ is $l_{cop}-1$.

Accordingly, in embodiments the contribution of $I_{bal}$ may be determined in the second round of the encoding procedure as follows. The balance bits immediate effect is on the $$\underset{b_{rows} \times p}{P_{bal}}$$

bits, where $b_{rows}$ is the number of rows within A that contain balance bits (usually 1 or 2). Both $I_{bal}$ and $P_{bal}$ are part of bit chunk $A_1$ and therefore affect the BC chunks, for example bit chunk $BC_2$ as well as bit chunk $BC_1$.

First, $P_{bal}$ may be calculated according to Equation 11 below:

$$\underset{b_{rows} \times p}{P_{bal}} = \underset{b_{rows} \times k}{\tilde{I}_{bal}} \cdot \underset{k \times p}{G} \qquad \text{(Equation 11)}$$

Where $$\underset{b_{rows} \times k}{\tilde{I}_{bal}}$$

are $b_{rows}$ zero rows to which the $$\underset{1 \times l_{bal}}{I_{bal}}$$

bits were embedded in their appropriate locations, and added to the $$\underset{b_{rows} \times p}{P_{bal}}$$

calculated previously on the first round before the balance bits calculation.

Next, the above may be merged into $$\underset{1 \times (l_{bal} + b_{rows} \cdot p)}{IP_{bal}},$$

and $BC_1$ may be computed according to Equation 12 below:

$$\underset{1 \times s \cdot p}{BC_1} = \underset{1 \times (l_{bal} + b_{rows} \cdot p)}{IP_{bal}} \cdot \underset{(l_{bal} + b_{rows} \cdot p) \times (s \cdot p)}{T_{bal \to BC_1}} \qquad \text{(Equation 12)}$$

This may be added to the $$\underset{1 \times s \cdot p}{BC_1}$$

calculated in the first round of the encoding procedure. In embodiments, the bit chunk $B_1$ and the bit chunk $C_1$ may be adjusted accordingly.

In embodiments, $T_{bal \to BC_1}$ may be a sparse matrix, which may result in a low complexity operation relative to the dimensions involved.

Figure 15A:
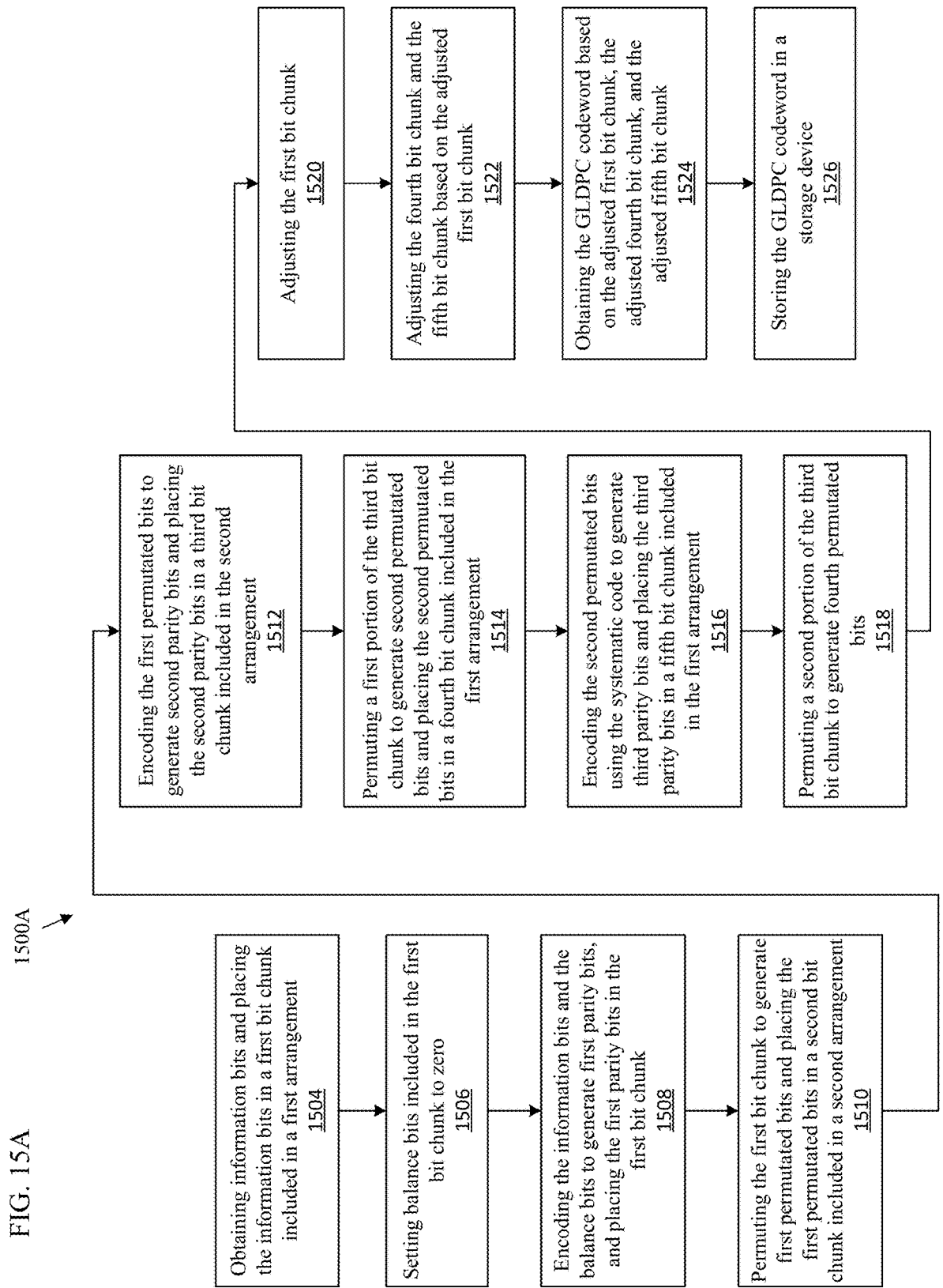
FIGS. 15A-15B are flowcharts of processes for controlling storage systems and devices, according to embodiments.

FIG. 15A is a block diagram of an example of a process 1500A of controlling a storage system, according to embodiments. In some implementations, one or more process blocks of FIG. 15A may be performed by memory system 1000, or any other element described herein, for example memory controller 100 or encoder 104.

As further shown in FIG. 15A, at operation 1504 the process 1500A may include obtaining information bits and placing the information bits in a first bit chunk included in a first arrangement of a generalized low-density parity-check (GLDPC) codeword. In embodiments, the first arrangement may correspond to the arrangement $J_1$, and the first bit chunk may correspond to the bit chunk $A_1$.

As further shown in FIG. 15A, at operation 1506 the process 1500A may include setting balance bits included in the first bit chunk to zero.

As further shown in FIG. 15A, at operation 1508 the process 1500A may include encoding the information bits and the balance bits using a systematic code to generate first parity bits, and placing the first parity bits in the first bit chunk. In embodiments, the systematic code may correspond to the constituent code or component code.

As further shown in FIG. 15A, at operation 1510 the process 1500A may include permuting the first bit chunk to generate first permutated bits, and placing the first permutated bits in a second bit chunk included in a second arrangement of the GLDPC codeword. In embodiments, the second arrangement may correspond to the arrangement $J_2$, and the second bit chunk may correspond to the bit chunk $A_2$.

As further shown in FIG. 15A, at operation 1512 the process 1500A may include encoding the first permutated bits using the systematic code to generate second parity bits and placing the second parity bits in a third bit chunk included in the second arrangement. In embodiments, the third bit chunk may correspond to the bit chunk $BC_2$.

As further shown in FIG. 15A, at operation 1514 the process 1500A may include permuting a first portion of the third bit chunk to generate second permutated bits, and placing the second permutated bits in a fourth bit chunk included in the first arrangement. In embodiments, the first portion of the third bit chunk may correspond to the bit chunk $B_2$, and the fourth bit chunk may correspond to the bit chunk $B_1$.

As further shown in FIG. 15A, at operation 1516 the process 1500A may include encoding the second permutated bits using the systematic code to generate third parity bits; and placing the third parity bits in a fifth bit chunk included in the first arrangement. In embodiments, the fifth bit chunk may correspond to the bit chunk $C_1$.

As further shown in FIG. 15A, at operation 1518 the process 1500A may include permuting a second portion of the third bit chunk to generate fourth permutated bits. In embodiments, the second portion of the third bit chunk may correspond to the bit chunk $C_2$.

As further shown in FIG. 15A, at operation 1520 the process 1500A may include adjusting the first bit chunk by adjusting the balance bits based on a comparison between the fourth bit chunk and the fourth permutated bits.

As further shown in FIG. 15A, at operation 1522 the process 1500A may include adjusting the fourth bit chunk and the fifth bit chunk based on the adjusted first bit chunk.

As further shown in FIG. 15A, at operation 1524 the process 1500A may include obtaining the GLDPC codeword based on the adjusted first bit chunk, the adjusted fourth bit chunk, and the adjusted fifth bit chunk.

As further shown in FIG. 15A, at operation 1526 the process 1500A may include storing the GLDPC codeword in a storage device. In embodiments, the storage device may correspond to memory system 1000 or memory device 1100.

In embodiments, a bijective mapping may exist between the first arrangement and the second arrangement, and within the bijective mapping, bits of the first bit chunk may be mapped exclusively to bits of the second bit chunk, bits of the fourth bit chunk may be mapped exclusively to bits of the first portion of the third bit chunk, and bits of the fifth bit chunk may be mapped exclusively to bits of the second portion of the third bit chunk.

In embodiments, the first arrangement may include a first plurality of rows and the second arrangement may include a second plurality of rows, and a number of the first plurality of rows may be different from a number of the second plurality of rows.

In embodiments, each row of the first plurality of rows and the second plurality of rows may include a codeword of the systematic code, and the systematic code may include at least one from among a Reed-Muller code, a Hadamard code, a Bose-Chaudhuri-Hocquenghem code, and a Hamming code.

Figure 15B:
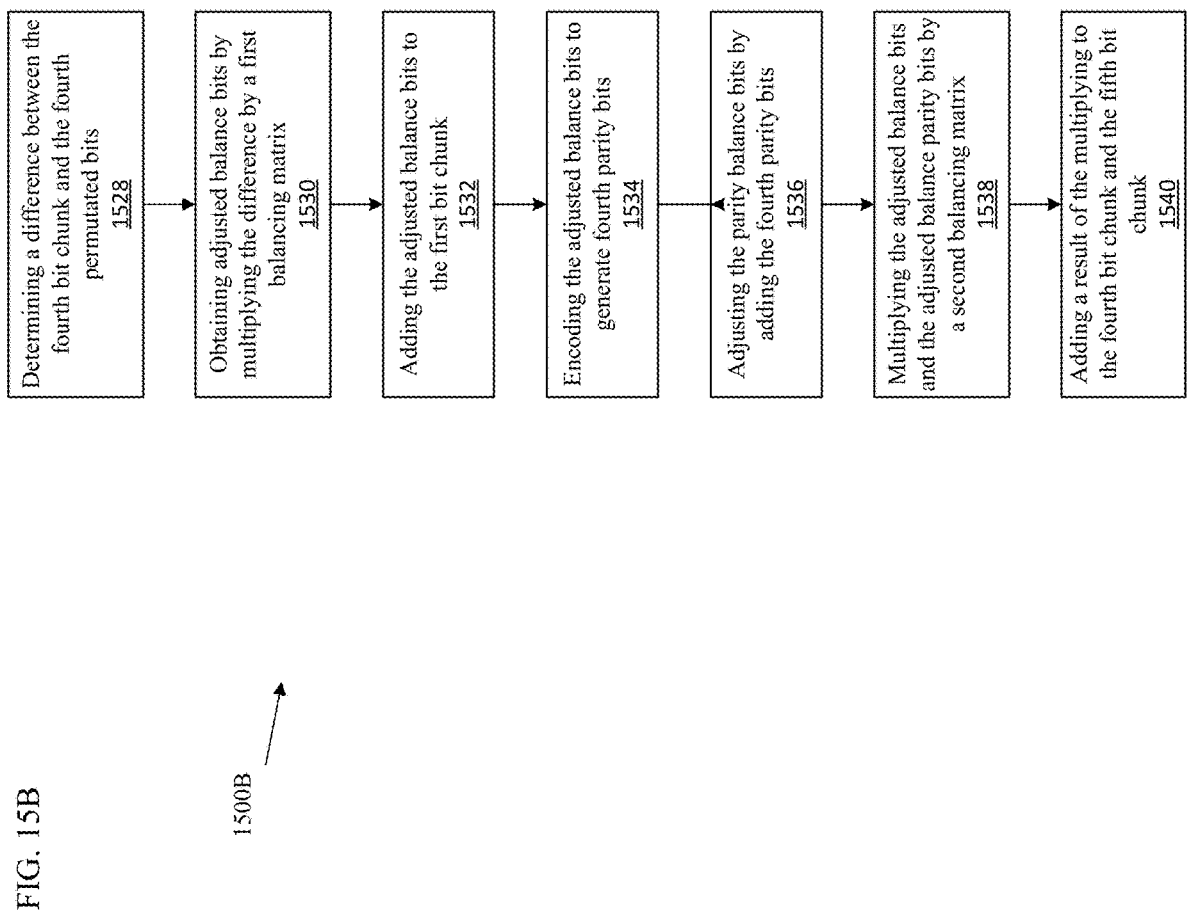

FIG. 15B is a flowchart of a process 1500B of controlling a storage system, according to embodiments. In some implementations, one or more process blocks of FIG. 15B may be performed by memory system 1000, or any other element described herein, for example encoder 104.

In embodiments, one or more process blocks of process 1500B may be performed after process blocks of process 1500A.

As shown in FIG. 15B, at operation 1528 the process 1500B may include determining a difference between the fourth bit chunk and the fourth permutated bits.

As further shown in FIG. 15B, at operation 1530 process 1500B may include obtaining adjusted balance bits by multiplying the difference by a first balancing matrix.

As further shown in FIG. 15B, at operation 1532 process 1500B may include adding the adjusted balance bits to the first bit chunk.

As further shown in FIG. 15B, at operation 1534 process 1500B may include encoding the adjusted balance bits using the systematic code to generate fourth parity bits.

As further shown in FIG. 15B, at operation 1536 process 1500B may include adjusting the parity balance bits by adding the fourth parity bits.

As further shown in FIG. 15B, at operation 1538 process 1500B may include multiplying the adjusted balance bits and the adjusted balance parity bits by a second balancing matrix.

As further shown in FIG. 15B, at operation 1540 process 1500B may include adding a result of the multiplying to the fourth bit chunk and the fifth bit chunk.

Although FIGS. 15A-15B show example blocks of the processes 1500A-1500B, in some implementations, the processes 1500A-1500B may include additional blocks, fewer blocks, different blocks, or differently arranged blocks than those depicted in FIGS. 15A-15B. Additionally, or alternatively, two or more of the blocks of the processes 1500A-1500B may be arranged or combined in any order, or performed in parallel. For example, in embodiments the operations 1528-1536 may be included in operation 1520. As another example, in embodiments the operations 1538-1540 may be included in operation 1522.

Figure 16:
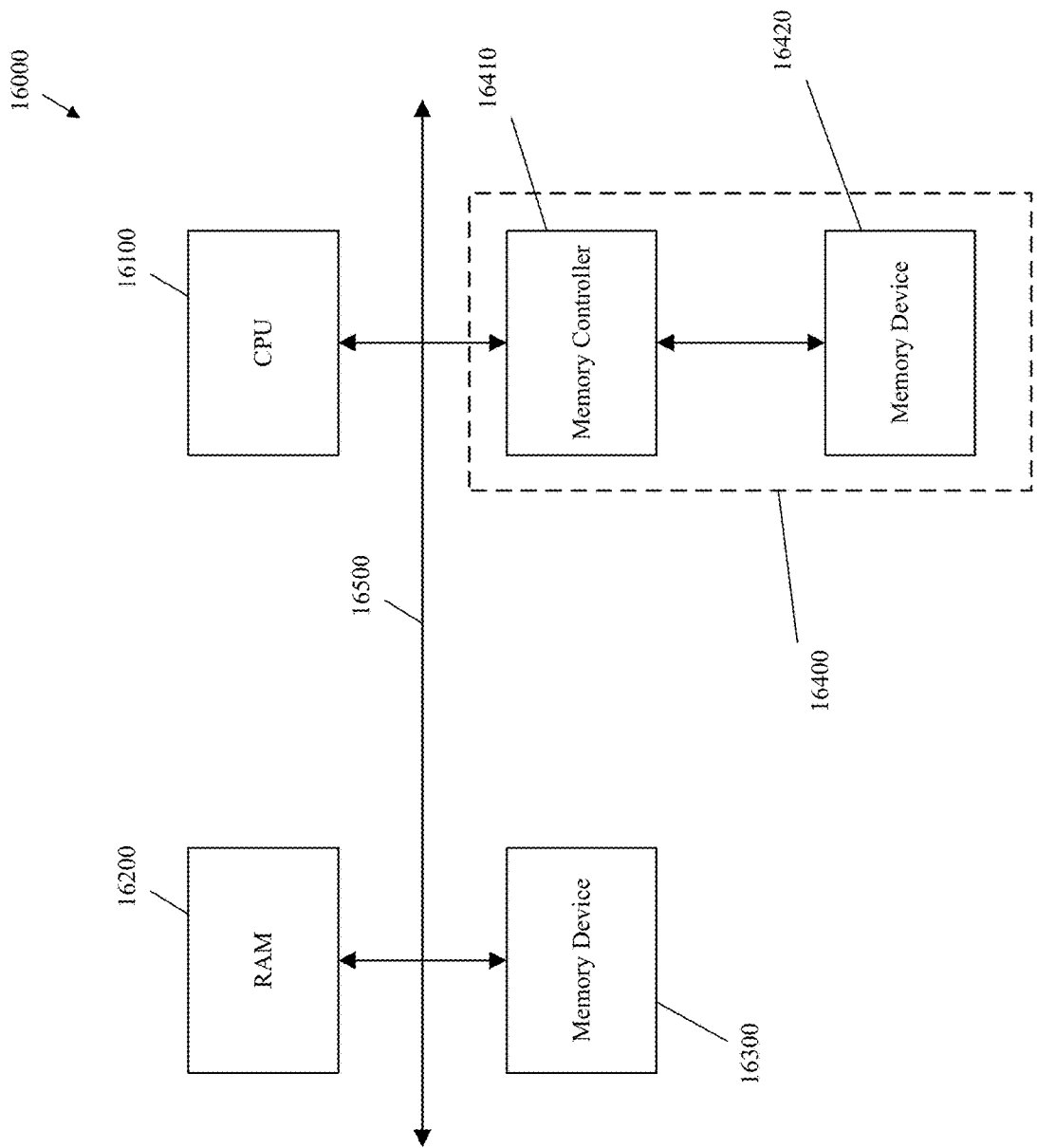
FIG. 16 is a block diagram of computer system including a memory system according to embodiments.

FIG. 16 is a block diagram of a computer system 16000 including a memory system according to embodiments. The computer system 16000, such as a mobile device, a desktop computer, and a server, may employ a memory system 16400 according to embodiments.

The computer system 16000 may include a central processing unit 16100, a RAM 16200, a user interface 16300, and the memory system 16400, are electrically connected to buses 16500. The host as described above may include the central processing unit 16100, the RAM 16200, and the user interface 16300 in the computer system 16000. The central processing unit 16100 may control the entire computer system 16000 and may perform calculations corresponding to user commands input via the user interface 16300. The RAM 16200 may function as a data memory for the central processing unit 16100, and the central processing unit 16100 may write/read data to/from the memory system 16400.

As in example embodiments described above, the memory system 16400 may include a memory controller 16410 and a memory device 16420. The memory controller 16410 may include an encoder and a decoder, and the memory device 16420 may include a cell array including a plurality of memory cells.

According to embodiments, the memory controller 16410 may be implemented by the memory controller 100 discussed above with reference to FIG. 1, and the memory device 11420 may be implemented by the memory device 110 discussed above with reference to FIG. 1.

Figure 17:
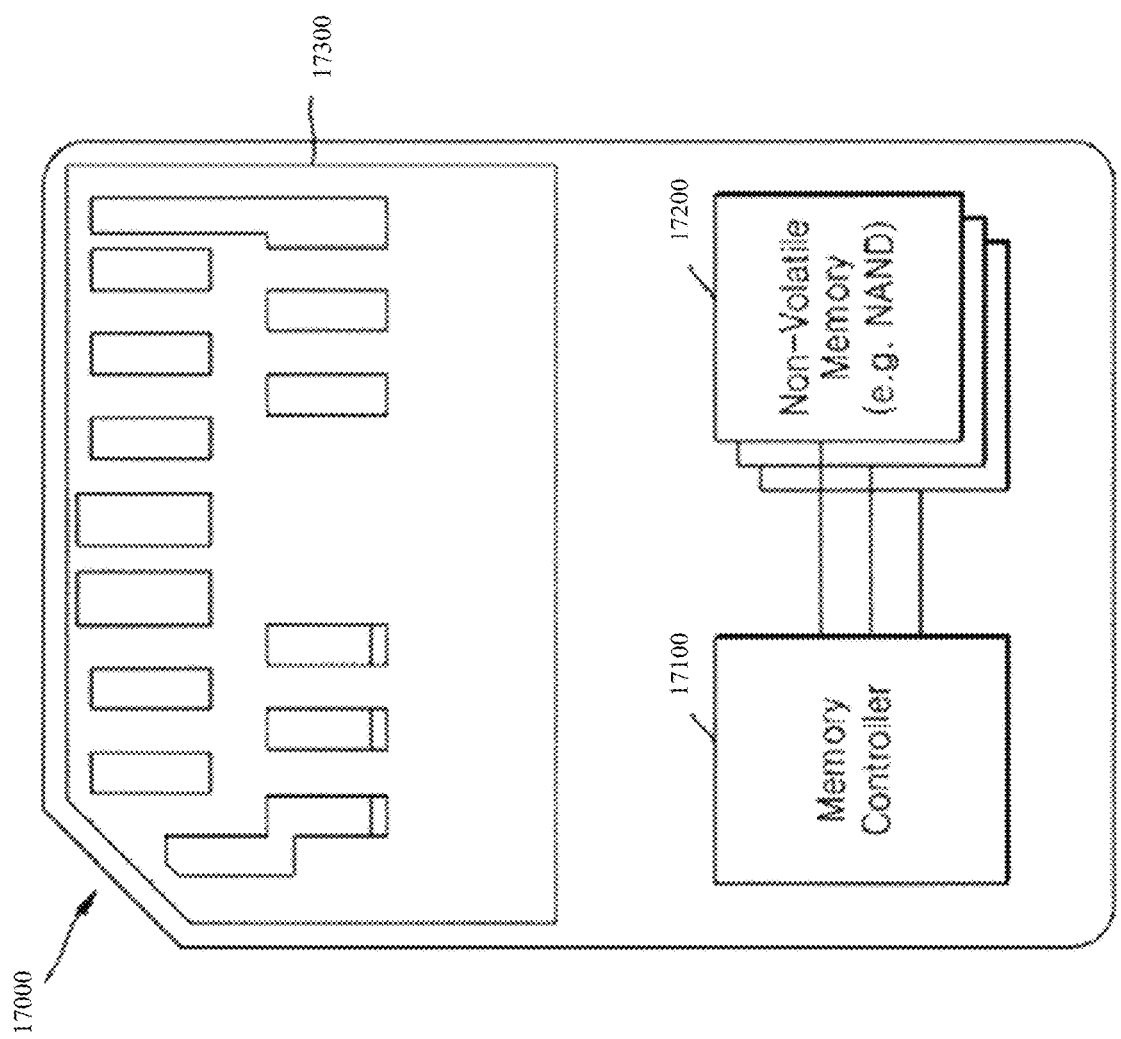
FIG. 17 is a block diagram of a memory card according to embodiments.

FIG. 17 is a block diagram showing a memory card 17000 according to embodiments. The memory system 1000 according to example embodiments discussed above with reference to FIG. 1 may be the memory card 17000. For example, the memory card 17000 may include an embedded multimedia card (eMMC), a secure digital (SD) card, or a Universal Flash Storage (UFS) card. As shown in FIG. 17, the memory card 17000 may include a memory controller 17100, a non-volatile memory 17200, and a port region 17300. The memory controller 17100 may be implemented by the controller 100 discussed above with reference to FIG. 1, and the non-volatile memory 12200 shown in FIG. 17 may be implemented by the memory device 110 discussed above with reference to FIG. 1.

The memory controller 17100 may include an encoder and a decoder. The encoder and the decoder may perform an encoding method and a decoding method according to embodiments. The memory controller 17100 may communicate with an external host via the port region 17300 in compliance with a pre-set protocol. The protocol may be eMMC protocol, SD protocol, SATA protocol, SAS protocol, USB protocol, UFS protocol, nonvolatile memory express (NVMe) protocol, peripheral component interconnect express (PCIe) protocol, or compute express link (CXL) protocol. The non-volatile memory 17200 may include memory cells which retain data stored therein even if power supplied thereto is blocked. For example, the non-volatile memory 17200 may include a flash memory, a magnetic random access memory (MRAM), a resistance RAM (RRAM), a ferroelectric RAM (FRAM), or a phase change memory (PCM).

According to embodiments, memory controller 17100 and non-volatile memory 17200 may be implemented, respectively, by the memory controller 100 and the memory device 110 discussed above with reference to FIG. 1.

Figure 18:
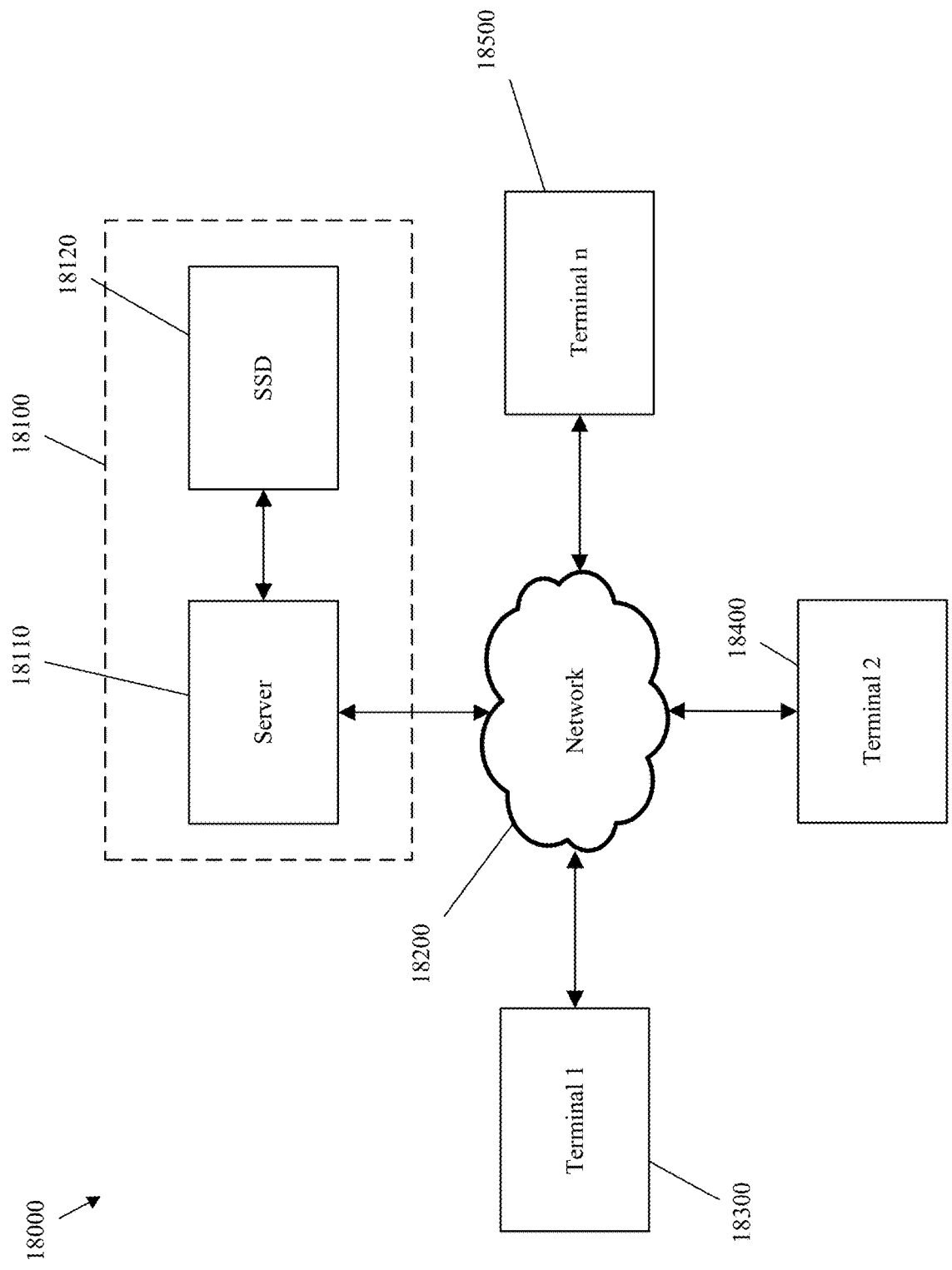
FIG. 18 is a block diagram of a network system including a memory system according to embodiments.

FIG. 18 is a block diagram of a network system 18000 including a memory system according to embodiments. As shown in FIG. 18, the network system 18000 may include a server system 18100 and a plurality of terminals 18300, 18400, and 18500 that are connected via a network 18200. The server system 18100 may include a server 18110 for processing requests received from the plurality of terminals 18300, 18400, and 18500 connected to the network 18200 and an SSD 18120 for storing data corresponding to the requests received from the terminals 18300, 18400, and 18500. Here, the SSD 18120 may be a memory system according to embodiments.

According to embodiments, SSD 18120 may be implemented by the memory system 1000 discussed above with reference to FIG. 1.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of the embodiments and is not to be construed as limiting thereof. Although a few embodiments have been described, those skilled in the art will readily appreciate that many modifications are possible in the embodiments without materially departing from the present scope.

Selected Notations and Abbreviations:

$n_{full}$: full length (non-shortened) of a subcodeword
$k_{full}$: full length (non-shortened) of a sub infoword
short: Number of shortened bits within a codeword/inforword
$k=k_{full}-short$: Length of a sub infoword.
$n=n_{full}-short$: Length of a subcodeword
$p=n-k$: Length of parity per subcodeword
G: constituent code generating matrix. Left systematic (G= (I; A))
s: Number of subcodewords in a GLDPC codeword
t: Number of subcodewords in the Info chunk
J: Number of equivalent arrangements of a GLDPC codeword
$ind_A$, $ind_B$, $ind_c$: Permutation indices per chunk
$ind_{sh}$: Indices of bits that are part of the GLDPC codeword but are not transmitted. Considered by the Decoder to have a known value ('0')
$l_{cop}$: Length of Check-On-Checks chunk (bits)
$ind_{Bal}$: Indices of balancing bits
$T_{bal}$, $T_{Bal}^{-1}$: balance bits to CoC transfer matrix (and its inverse)

$T_{bal \to BC_1}$ :
$(l_{bal}+b_{rows} \cdot p) \times (s \cdot p)$ balance bits (and their corresponding parity) to $BC_1$ chunk transfer matrix
$l_{unused}$: Number of transmitted but unused bits. Considered by the Decoder to have a known value ('0')
$\pi_{1 \to 2}(J_1)$, $\pi_{2 \to 1}(J_2)$: Permutation between $J_1$ and $J_2$ arrangements
$I_0$: Number of pure information bits
$P_0$: Number of bits allocated for other purposes than info; parity, balancing, CRC etc.
$N_0=I_0+P_0$: Total number of transmitted bits
$sh_{total}$: Number of non-transmitted bits, that are considered part of the GLDPC codeword
$N=N_0+sh_{total}$: Total number of bits $$OH = \frac{P_0}{I_0}:$$

Overhead of codeword
$ind_{CRC}$: the indices of the CRC sequence bits
$l_{CRC}$: Length of CRC sequence (bits)
$g_{CRC}$: CRC code generating polynomial

What is claimed is:

1. A storage system, comprising:
a storage device configured to store a plurality of generalized low-density parity-check (GLDPC) codewords;
at least one processor configured to:
obtain information bits, and place the information bits in a first bit chunk included in a first arrangement of a GLDPC codeword;
set balance bits included in the first bit chunk to zero;
encode the information bits and the balance bits using a systematic code to generate first parity bits, and place the first parity bits in the first bit chunk;
permute the first bit chunk to generate first permutated bits, and place the first permutated bits in a second bit chunk included in a second arrangement of the GLDPC codeword;
encode the first permutated bits using the systematic code to generate second parity bits, and place the second parity bits in a third bit chunk included in the second arrangement;
permute a first portion of the third bit chunk to generate second permutated bits, and place the second permutated bits in a fourth bit chunk included in the first arrangement;
encode the second permutated bits using the systematic code to generate third parity bits, and place the third parity bits in a fifth bit chunk included in the first arrangement;
permute a second portion of the third bit chunk to generate fourth permutated bits;
adjust the first bit chunk by adjusting the balance bits based on a comparison between the fourth bit chunk and the fourth permutated bits, and adjust the fourth bit chunk and the fifth bit chunk based on the adjusted first bit chunk;
obtain the GLDPC codeword based on the adjusted first bit chunk, the adjusted fourth bit chunk, and the adjusted fifth bit chunk; and
store the GLDPC codeword in the storage device.

2. The storage system of claim 1, wherein a bijective mapping exists between the first arrangement and the second arrangement, and
wherein within the bijective mapping, bits of the first bit chunk are mapped exclusively to bits of the second bit chunk, bits of the fourth bit chunk are mapped exclusively to bits of the first portion of the third bit chunk, and bits of the fifth bit chunk are mapped exclusively to bits of the second portion of the third bit chunk.

3. The storage system of claim 1, wherein the first arrangement comprises a first plurality of rows and the second arrangement comprises a second plurality of rows, and
wherein a number of the first plurality of rows is different from a number of the second plurality of rows.

4. The storage system of claim 3, wherein each row of the first plurality of rows and the second plurality of rows comprises a codeword of the systematic code, and
wherein the systematic code comprises at least one from among a Reed-Muller code, a Hadamard code, a Bose-Chaudhuri-Hocquenghem code, and a Hamming code.

5. The storage system of claim 1, wherein the adjusting of the balance bits comprises:
determining a difference between the fourth bit chunk and the fourth permutated bits; and
obtaining adjusted balance bits by multiplying the difference by a first balancing matrix.

6. The storage system of claim 5, wherein the first parity bits include parity balance bits corresponding to the balance bits, and
wherein the adjusting of the first bit chunk comprises:
adding the adjusted balance bits to the first bit chunk;
encoding the adjusted balance bits using the systematic code to generate fourth parity bits; and
adjusting the parity balance bits by adding the fourth parity bits.

7. The storage system of claim 6, wherein the adjusting of the fourth bit chunk and the fifth bit chunk comprises:
multiplying the adjusted balance bits and the adjusted balance parity bits by a second balancing matrix; and
adding a result of the multiplying to the fourth bit chunk and the fifth bit chunk.

8. A device for encoding information bits for storage in a storage device, the device comprising:
a memory interface configured to communicate with the storage device; and
at least one processor configured to:
encode information bits and balance bits using a first coding scheme to obtain a first bit chunk included in a first arrangement of a codeword corresponding to a second coding scheme;
permute the first bit chunk to obtain a second bit chunk included in a second arrangement of the codeword corresponding to the second coding scheme;
encode bits of the second bit chunk using the first coding scheme to obtain a third bit chunk included in the second arrangement;
permute a first portion of the third bit chunk to obtain a fourth bit chunk included in the first arrangement, and encode bits of the fourth bit chunk using the first coding scheme to obtain a fifth bit chunk included in the first arrangement;
permute a second portion of the third bit chunk, and adjust the balance bits based on a comparison between the fifth bit chunk and the permutated second portion of the third bit chunk;
adjust the first arrangement based on the adjusted balance bits, and obtain the codeword corresponding to the second coding scheme based on the adjusted first arrangement; and
control the memory interface to transmit the obtained codeword to the storage device.

9. The device of claim 8, wherein the first coding scheme comprises at least one from among a Reed-Muller coding scheme, a Hadamard coding scheme, a Bose-Chaudhuri-Hocquenghem coding scheme, and a Hamming coding scheme, and
wherein the second coding scheme comprises a GLDPC coding scheme.

10. The device of claim 8, wherein a bijective mapping exists between the first arrangement and the second arrangement, and
wherein within the bijective mapping, bits of the first bit chunk are mapped exclusively to bits of the second bit chunk, bits of the fourth bit chunk are mapped exclusively to bits of the first portion of the third bit chunk, and bits of the fifth bit chunk are mapped exclusively to bits of the second portion of the third bit chunk.

11. The device of claim 8, wherein the first arrangement comprises a first plurality of rows and the second arrangement comprises a second plurality of rows, and
wherein a number of the first plurality of rows is different from a number of the second plurality of rows.

12. The device of claim 11, wherein each row of the first plurality of rows and the second plurality of rows comprises a codeword corresponding to the first coding scheme.

13. The device of claim 8, wherein the adjusting of the balance bits comprises:
determining a difference between the fourth bit chunk and the permutated second portion of the third bit chunk; and
obtaining adjusted balance bits by multiplying the difference by a first balancing matrix.

14. The device of claim 13, wherein the first bit chunk includes parity balance bits corresponding to the balance bits, and
wherein the adjusting of the first arrangement comprises:
adding the adjusted balance bits to the first bit chunk;
encoding the adjusted balance bits using the first coding scheme to generate second parity bits; and
adjusting the parity balance bits by adding the second parity bits.

15. The device of claim 14, wherein the adjusting of the first arrangement further comprises:
multiplying the adjusted balance bits and the adjusted parity balance bits by a second balancing matrix; and
adding a result of the multiplying to the fourth bit chunk and the fifth bit chunk.

16. A method of controlling a storage system, the method being executed by at least one processor and comprising:
obtaining information bits, and placing the information bits in a first bit chunk included in a first arrangement of a generalized low-density parity-check (GLDPC) codeword;
setting balance bits included in the first bit chunk to zero;
encoding the information bits and the balance bits using a systematic code to generate first parity bits, and placing the first parity bits in the first bit chunk;
permuting the first bit chunk to generate first permutated bits, and placing the first permutated bits in a second bit chunk included in a second arrangement of the GLDPC codeword;
encoding the first permutated bits using the systematic code to generate second parity bits, and placing the second parity bits in a third bit chunk included in the second arrangement;

permuting a first portion of the third bit chunk to generate second permutated bits, and placing the second permutated bits in a fourth bit chunk included in the first arrangement;

encoding the second permutated bits using the systematic code to generate third parity bits, and placing the third parity bits in a fifth bit chunk included in the first arrangement;

permuting a second portion of the third bit chunk to generate fourth permutated bits;

adjusting the first bit chunk by adjusting the balance bits based on a comparison between the fourth bit chunk and the fourth permutated bits, and adjusting the fourth bit chunk and the fifth bit chunk based on the adjusted first bit chunk;

obtaining the GLDPC codeword based on the adjusted first bit chunk, the adjusted fourth bit chunk, and the adjusted fifth bit chunk; and storing the GLDPC codeword in a storage device.

17. The method of claim 16, wherein a bijective mapping exists between the first arrangement and the second arrangement, and wherein within the bijective mapping, bits of the first bit chunk are mapped exclusively to bits of the second bit chunk, bits of the fourth bit chunk are mapped exclusively to bits of the first portion of the third bit chunk, and bits of the fifth bit chunk are mapped exclusively to bits of the second portion of the third bit chunk.

18. The method of claim 16, wherein the first arrangement comprises a first plurality of rows and the second arrangement comprises a second plurality of rows, and wherein a number of the first plurality of rows is different from a number of the second plurality of rows.

19. The method of claim 18, wherein each row of the first plurality of rows and the second plurality of rows comprises a codeword of the systematic code, and wherein the systematic code comprises at least one from among a Reed-Muller code, a Hadamard code, a Bose-Chaudhuri-Hocquenghem code, and a Hamming code.

20. The method of claim 16, wherein the adjusting of the balance bits comprises:

determining a difference between the fourth bit chunk and the fourth permutated bits; and obtaining adjusted balance bits by multiplying the difference by a first balancing matrix.

\* \* \* \* \*